US009881686B2

(12) United States Patent
Zhao et al.

(10) Patent No.: US 9,881,686 B2
(45) Date of Patent: *Jan. 30, 2018

(54) APPARATUSES AND METHODS TO CONTROL BODY POTENTIAL IN 3D NON-VOLATILE MEMORY OPERATIONS

(71) Applicant: Micron Technology, Inc., Boise, ID (US)

(72) Inventors: Han Zhao, Santa Clara, CA (US); Akira Goda, Boise, ID (US); Krishna K. Parat, Palo Alto, CA (US); Aurelio Giancarlo Mauri, Meda (IT); Haitao Liu, Boise, ID (US); Toru Tanzawa, Tokyo (JP); Shigekazu Yamada, Suginamiku (JP); Koji Sakui, Setagayaku (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/393,719

(22) Filed: Dec. 29, 2016

(65) Prior Publication Data

US 2017/0110198 A1   Apr. 20, 2017

Related U.S. Application Data

(60) Continuation of application No. 14/746,416, filed on Jun. 22, 2015, now Pat. No. 9,536,618, which is a
(Continued)

(51) Int. Cl.
*G11C 16/34* (2006.01)
*G11C 16/32* (2006.01)
(Continued)

(52) U.S. Cl.
CPC ...... *G11C 16/3459* (2013.01); *G11C 16/0483* (2013.01); *G11C 16/08* (2013.01);
(Continued)

(58) Field of Classification Search
CPC . G11C 16/3459; G11C 16/32; G11C 16/0483; G11C 16/08; G11C 16/3445; G11C 16/26; G11C 16/16
See application file for complete search history.

(56) References Cited

U.S. PATENT DOCUMENTS

| 5,784,319 A | 7/1998 | Villa et al. |
| 7,023,736 B2 | 4/2006 | Cernea |

(Continued)

FOREIGN PATENT DOCUMENTS

| CN | 1832046 A | 9/2006 |
| CN | 101364440 A | 2/2009 |

(Continued)

OTHER PUBLICATIONS

"Chinese Application Serial No. 201480028683.X, Preliminary Amendment dated Mar. 24, 2016", w/ English Claims, 18 pgs.
(Continued)

*Primary Examiner* — Harry W Byrne
*Assistant Examiner* — Ajay Ojha
(74) *Attorney, Agent, or Firm* — Schwegman Lundberg & Woessner, P.A.

(57) ABSTRACT

Some embodiments include apparatuses and methods having a memory cell string including memory cells located in different levels of the apparatus and a data line coupled to the memory cell string. The memory cell string includes a pillar body associated with the memory cells. At least one of such apparatus can include a module configured to store information in a memory cell among memory cells and/or to determine a value of information stored in a memory cell
(Continued)

among memory cells. The module can also be configured to apply a voltage having a positive value to the data line and/or a source to control a potential of the body. Other embodiments are described.

18 Claims, 16 Drawing Sheets

Related U.S. Application Data division of application No. 13/707,067, filed on Dec. 6, 2012, now Pat. No. 9,064,577.

(51) Int. Cl.
    *G11C 16/04*     (2006.01)
    *G11C 16/16*     (2006.01)
    *G11C 16/26*     (2006.01)
    *G11C 16/08*     (2006.01)

(52) U.S. Cl.
    CPC ............ *G11C 16/16* (2013.01); *G11C 16/26* (2013.01); *G11C 16/32* (2013.01); *G11C 16/3445* (2013.01)

(56) References Cited

U.S. PATENT DOCUMENTS

| | | |
|---|---|---|
| 7,057,931 B2 | 6/2006 | Lutze et al. |
| 7,626,866 B2 | 12/2009 | Aritome |
| 7,869,261 B2 | 1/2011 | Ozawa |
| 7,893,084 B2 | 2/2011 | Beaulieu et al. |
| 7,898,317 B2 | 3/2011 | Choi |
| 7,920,431 B2 | 4/2011 | Nobunaga et al. |
| 7,995,400 B2 | 8/2011 | Sarin |
| 8,068,364 B2 | 11/2011 | Maejima |
| 8,102,711 B2 | 1/2012 | Maejima |
| 8,120,952 B2 | 2/2012 | Han |
| 8,194,453 B2 | 6/2012 | Maejima |
| 8,243,518 B2 * | 8/2012 | Oh ............... G11C 16/0483 365/185.18 |
| 8,976,594 B2 | 3/2015 | Tanzawa |
| 8,995,188 B2 | 3/2015 | Tanzawa |
| 9,064,551 B2 | 6/2015 | Tanzawa |
| 9,064,577 B2 | 6/2015 | Zhao et al. |
| 9,224,477 B2 | 12/2015 | Tanzawa |
| 9,349,470 B2 | 5/2016 | Tanzawa |
| 9,536,618 B2 | 1/2017 | Zhao et al. |
| 2001/0004327 A1 | 6/2001 | Dallabora et al. |
| 2004/0125629 A1 | 7/2004 | Scheuerlein et al. |
| 2005/0101236 A1 | 5/2005 | Wang et al. |
| 2005/0254302 A1 | 11/2005 | Noguchi |
| 2006/0034137 A1 | 2/2006 | Zanardi |
| 2006/0034140 A1 | 2/2006 | Ogawa |
| 2006/0072359 A1 | 4/2006 | Futatsuyama et al. |
| 2006/0083066 A1 | 4/2006 | Hasegawa et al. |
| 2006/0146608 A1 | 7/2006 | Fasoli et al. |
| 2007/0047633 A1 | 3/2007 | Tung et al. |
| 2007/0076509 A1 | 4/2007 | Zhang |
| 2007/0217263 A1 | 9/2007 | Fasoli et al. |
| 2007/0230253 A1 | 10/2007 | Kim |
| 2008/0023747 A1 | 1/2008 | Park et al. |
| 2009/0040832 A1 | 2/2009 | Park |
| 2009/0116285 A1 | 5/2009 | Youn |
| 2009/0267128 A1 | 10/2009 | Maejima |
| 2010/0124116 A1 * | 5/2010 | Maeda ............... G11C 5/02 365/185.11 |
| 2011/0013458 A1 * | 1/2011 | Seol ............... G11C 16/0483 365/185.18 |
| 2011/0058427 A1 | 3/2011 | Choi et al. |
| 2011/0069550 A1 | 3/2011 | Maejima |
| 2011/0157978 A1 | 6/2011 | Shinozaki et al. |
| 2011/0164452 A1 | 7/2011 | Parker |
| 2011/0199829 A1 | 8/2011 | Lee et al. |
| 2011/0267887 A1 | 11/2011 | Sekar et al. |
| 2011/0273945 A1 | 11/2011 | Donkoh |
| 2011/0280085 A1 | 11/2011 | Damle et al. |
| 2012/0147648 A1 | 6/2012 | Scheuerlein |
| 2012/0147673 A1 | 6/2012 | Nakamura et al. |
| 2012/0281471 A1 | 11/2012 | Hung et al. |
| 2013/0308385 A1 | 11/2013 | Tanzawa |
| 2013/0308387 A1 | 11/2013 | Tanzawa |
| 2014/0133238 A1 | 5/2014 | Rhie |
| 2014/0160851 A1 | 6/2014 | Zhao et al. |
| 2014/0313828 A1 | 10/2014 | Tanzawa |
| 2015/0179273 A1 | 6/2015 | Tanzawa |
| 2015/0262673 A1 | 9/2015 | Tanzawa |
| 2015/0287472 A1 | 10/2015 | Zhao et al. |
| 2016/0267998 A1 | 9/2016 | Tanzawa |

FOREIGN PATENT DOCUMENTS

| | | |
|---|---|---|
| CN | 102467966 A | 5/2012 |
| CN | 102800361 A | 11/2012 |
| CN | 105144298 A | 12/2015 |
| CN | 105229745 A | 1/2016 |
| EP | 1720168 A1 | 11/2006 |
| KR | 1020090000319 A | 1/2009 |
| KR | 20150134438 A | 12/2015 |
| KR | 101643518 B1 | 7/2016 |
| TW | 201432698 A | 8/2014 |
| TW | 201511012 A | 3/2015 |
| TW | I502593 B | 10/2015 |
| WO | WO-2014089338 A1 | 6/2014 |
| WO | WO-2014172262 A1 | 10/2014 |

OTHER PUBLICATIONS

"International Application Serial No. PCT/US2013/073385, International Preliminary Report on Patentability dated Jun. 18, 2015", 9 pgs.

"International Application Serial No. PCT/US2013/073385, International Search Report dated Apr. 1, 2014", 4 pgs.

"International Application Serial No. PCT/US2013/073385, Written Opinion dated Apr. 1, 2014", 7 pgs.

"International Application Serial No. PCT/US2014/033968, International Preliminary Report on Patentability dated Oct. 29, 2015", 6 pgs.

"International Application Serial No. PCT/US2014/033968, International Search Report dated Aug. 13, 2014", 4 pgs.

"International Application Serial No. PCT/US2014/033968, Written Opinion dated Aug. 13, 2014", 4 pgs.

"Korean Application Serial No. 10-2015-7032629, Final Office Action dated Apr. 8, 2016", W/ English Translation, 5 pgs.

"Korean Application Serial No. 10-2015-7032629, Office Action dated Dec. 9, 2015", W/ English Translation, 4 pgs.

"Korean Application Serial No. 10-2015-7032629, Response filed Feb. 5, 2016 to Office Action dated Dec. 9, 2015", (English Translation of Claims), 14 pgs.

"Korean Application Serial No. 10-2015-7032629, Response filed Apr. 28, 2016 to Final Office Action dated Apr. 8, 2016", W/ English Claims, 10 pgs.

"Taiwanese Application Serial No. 103114070 Response dated Jun. 16, 2015 to Office Action dated Apr. 23, 2015", With the English claims, 28 pgs.

"Taiwanese Application Serial No. 103114070, Office Action dated Apr. 15, 2015", W/ English Translation, 10 pgs.

Cernea, Raul, et al., "A 34MB/s-Program-Throughput 16Gb MLC NAND with All-Bitline Architecture in 56nm", Digest of Technical Papers, IEEE International Solid-State Circuits Conference, 2008. ISSCC 2008., (Feb. 2008), 420-421, 624.

Katsumata, R., et al., "Pipe-shaped BiCS flash memory with 16 stacked layers and multi-level-cell operation for ultra high density storage devices", Symposium on VLSI Technology, (Jun. 2009), 136-37.

Tanaka, H., et al., "Bit Cost Scalable Technology with Punch and Plug Process for Ultra High Density Flash Memory", IEEE Symposium on VLSI Technology, (2007), 14-15.

(56) References Cited

OTHER PUBLICATIONS

Villa, Corrado, et al., "A 65 nm 1 Gb 2b/cell NOR Flash With 2.25 MB/s Program Throughput and 400 MB/s DDR Interface", IEEE Journal of Solid-State Circuits, vol. 43, No. 1, (Jan. 2008), 132-140.
"U.S. Appl. No. 15/162,238, Notice of Allowance dated Mar. 3, 2017", 5 pgs.
"U.S. Appl. No. 15/162,238, Response dated Jan. 17, 2017 to Non Final Office Action dated Sep. 15, 2016", 8 pgs.
"Chinese Application Serial No. 201480028683.X, Office Action dated Feb. 4, 2017", w/ English Translation, 16 pgs.
"Chinese Application Serial No. 201480028683.X, Office Action dated Aug. 3, 2016", (English Translation), 17 pgs.
"Chinese Application Serial No. 201480028683.X, Response dated Apr. 11, 2017 to Office Action dated Feb. 4, 2017", w/English Claims, 19 pgs.
"Chinese Application Serial No. 201480028683.X, Response dated Dec. 15, 2016 to Office Action dated Aug. 3, 2016", W/ English Translation of Claims, 57 pgs.
"Taiwanese Application Serial No. 102144697, Office Action dated May 12, 2017", w/ translation, proposed amendments, and comments, 78 pgs.

* cited by examiner

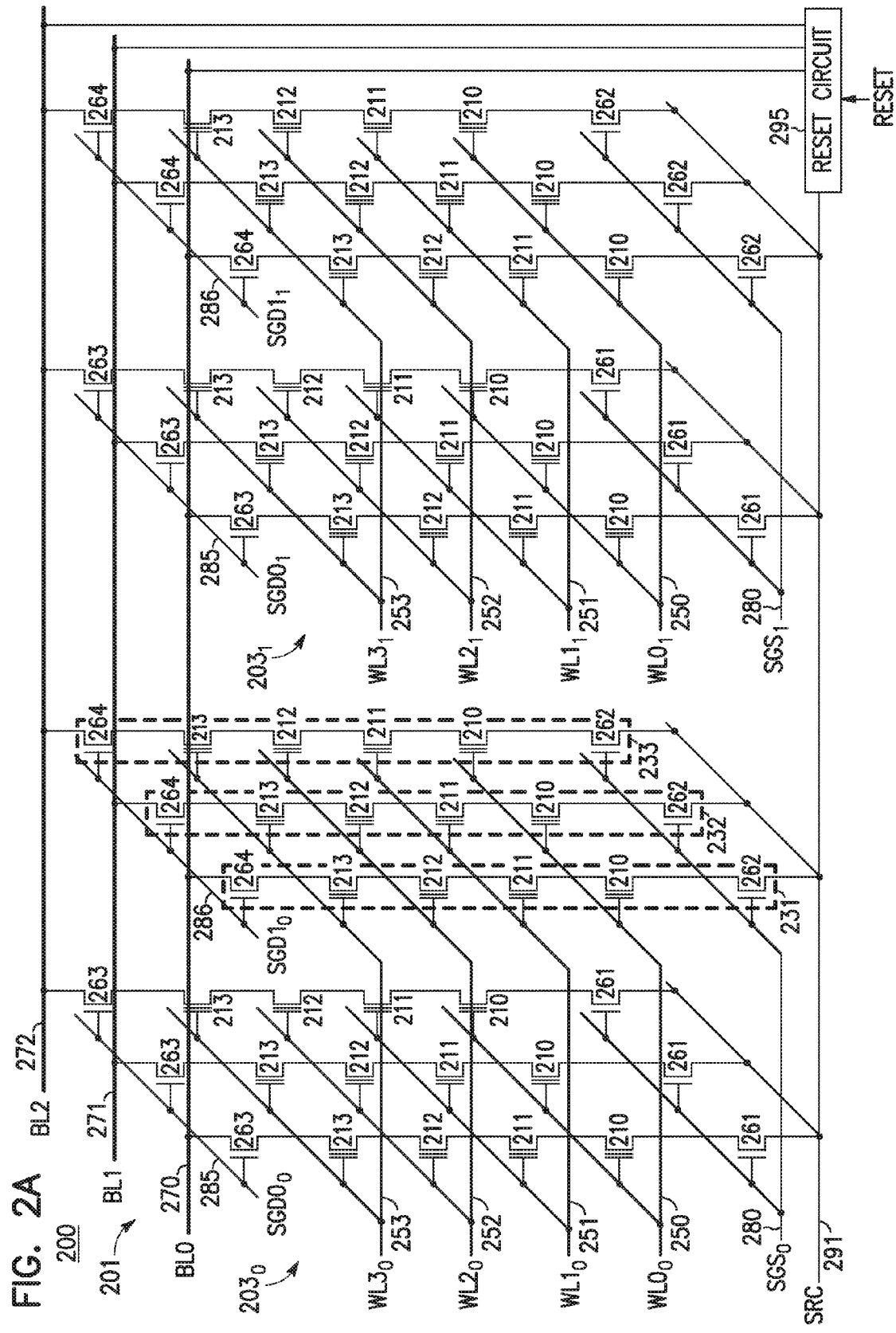

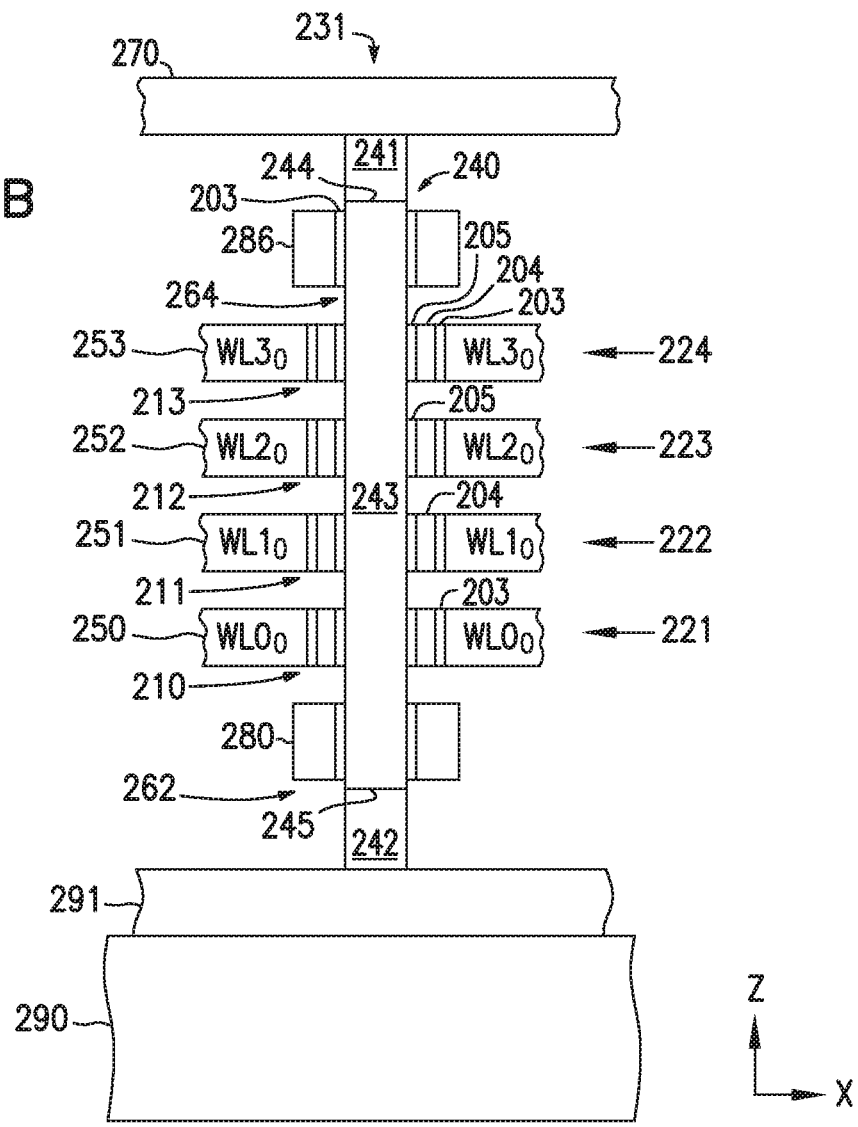

US 9,881,686 B2

APPARATUSES AND METHODS TO CONTROL BODY POTENTIAL IN 3D NON-VOLATILE MEMORY OPERATIONS

PRIORITY APPLICATION

This application is a continuation of U.S. application Ser. No. 14/746,416, filed Jun. 22, 2015, which is a divisional of U.S. application Ser. No. 13/707,067, filed Dec. 6, 2012, now issued as U.S. Pat. No. 9,064,577, all of which are incorporated herein by reference in their entirety.

BACKGROUND

Memory devices, such as flash memory, are widely used in computers and many electronic items. Such memory devices have numerous memory cells. Information can be stored in the memory cells in a write operation. The stored information can be obtained in a read operation or can be cleared in an erase operation. Some conventional read, write, and erase operations may generate excess carriers (e.g., electrons or holes) in some areas of the memory device. In some situations, such excess carriers may affect the reliability of these operations.

BRIEF DESCRIPTION OF THE DRAWINGS

FIG. 2A shows a schematic diagram of a portion of a memory device including a memory array having memory blocks and including a reset circuit, according to an embodiment of the invention.

FIG. 2B shows a side view of a structure of a portion of the memory device of FIG. 2A, according to an embodiment of the invention.

DETAILED DESCRIPTION

Figure 1:
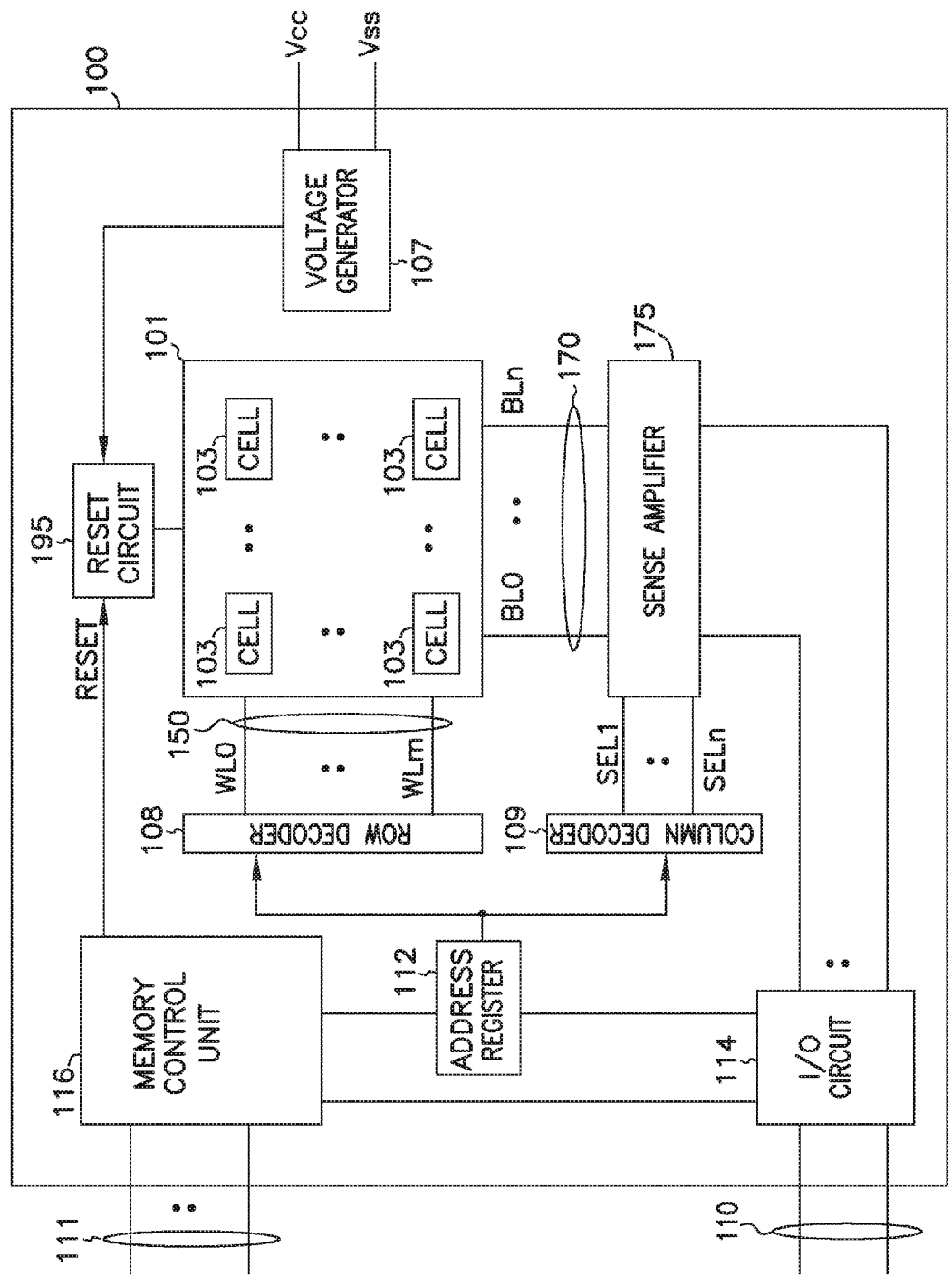
FIG. 1 shows a block diagram of an apparatus in the form of a memory device having a memory array and memory cells, according to an embodiment of the invention.

FIG. 1 shows a block diagram of an apparatus in the form of a memory device 100 having a memory array 101 and memory cells 103, according to an embodiment of the invention. Memory cells 103 can be arranged in rows and columns along with lines 150 and lines 170. Lines 150 can carry signals WL0 through WLm and can form part of access lines (e.g., word lines) of memory device 100. Lines 170 can carry signals BL0 through BLn and can form part of data lines (e.g., bit lines) of memory device 100.

A row decoder 108 and a column decoder 109 can respond to an address register 112 to access memory cells 103 based on row address and column address signals on lines 110, 111, or both. A sense amplifier 175 can operate to determine the values of information to be stored in memory cells 103 or the values of information obtained from memory cells 103. Sense amplifier 175 can respond to signals SLE1 through SLEn to selectively provide information between memory cells 103 an input/output (I/O) circuit 114. I/O circuit 114 can be configured to exchange information (e.g., provide signals) between sense amplifier 175 and lines 110. Lines 110 and 111 can include nodes within memory device 100 or pins (or solder balls) on a package where memory device 100 is located.

A memory control unit 116 can control operations of memory device 100 based on signals present on lines 110 and 111. A device (e.g., a processor or a memory controller) external to memory device 100 can send different commands (e.g., read, write, or erase command) to memory device 100 using different combinations of signals on lines 110, 111, or both.

Memory device 100 can respond to commands to perform memory operations on memory cells 103. For example, memory device 100 can perform a read operation to determine the value of information stored in memory cells 103 and a write (e.g., programming) operation to store (e.g., program) information in memory cells 103. Memory device 100 can also perform an erase operation to erase information from some or all of memory cells 103.

Memory device 100 can receive a supply voltage, including supply voltages Vcc and Vss. Supply voltage Vss can operate at a ground potential (e.g., having a value of approximately zero volts). Supply voltage Vcc can include an external voltage supplied to memory device 100 from an external power source such as a battery or an alternating-current to direct-current (AC-DC) converter circuitry. Memory device 100 can include a voltage generator 107 to generate voltages for use in operations of memory device 100, such as in read, write, and erase operations. Voltage generator 107 can include charge pumps, such as positive charge pumps (e.g., to provide pumped voltages having positive values) and negative charge pumps (e.g., to provide pumped voltage having negative values).

Memory device 100 can include a reset circuit 195 that can respond to a signal RESET to apply certain voltages to different elements (e.g., lines 150 and 170) of memory device 100 at specific stages of a memory operation (e.g., read, write, or erase) of memory device 100. Memory operations including different stages are described in more detail with reference to FIG. 2A through FIG. 14.

FIG. 1 shows reset circuit 195 being separated from other elements of memory device 200 as an example. A portion of reset circuit 195 or the entire reset circuit 195, however, can be part of another element or can include part of another element of memory device 100. For example, a portion of reset circuit 195 or the entire reset circuit 195 can be part of memory control unit 116 or other elements of memory device 100.

Each of memory cells 103 can be programmed to store information representing a value of a fraction of a bit, a value of a single bit, or a value of multiple bits such as two, three, four, or another number of bits. For example, each of memory cells 103 can be programmed to store information representing a binary value "0" or "1" of a single bit. The single bit per cell is sometimes called a single level cell. In another example, each of memory cells 103 can be programmed to store information representing a value for multiple bits, such as one of four possible values "00," "01," "10," and "11" of two bits, one of eight possible values "000," "001," "010," "011," "100," "101," "110," and "111" of three bits, or one of other values of another number of multiple bits. A cell that has the ability to store multiple bits is sometimes called a multi-level cell (or multi-state cell).

Memory device 100 can include a non-volatile memory device, and memory cells 103 can include non-volatile memory cells, such that memory cells 103 can retain information stored in them when power (e.g., Vcc, Vss, or both) is disconnected from memory device 100. For example, memory device 100 can be a flash memory device, such as a NAND flash or a NOR flash memory device, or another kind of memory device, such as a variable resistance memory device (e.g., a phase change or resistive random access memory (RAM) device).

Memory device 100 can include a memory device where memory cells 103 can be physically located in multiple levels on the same device, such that some of memory cells 103 can be stacked over some other memory cells 103 in multiple levels over a substrate (e.g., a semiconductor substrate) of memory device 100.

One of ordinary skill in the art may recognize that memory device 100 may include other elements, several of which are not shown in FIG. 1, so as not to obscure the example embodiments described herein.

At least a portion of memory device 100 can include structures and operate using memory operations (e.g., read, write, and erase operations) similar to or identical to memory devices described below with reference to FIG. 2A through FIG. 14.

FIG. 2A shows a schematic diagram of a portion of a memory device 200 including a memory array 201 having memory blocks $203_0$ and $203_1$, and including reset circuit 295, according to an embodiment of the invention. FIG. 2A shows memory device 200 and memory array 201 including two memory blocks $203_0$ and $203_1$ as an example. The number of memory blocks in memory device 200 can vary.

Memory device 200 can include lines 270, 271, and 272 that can carry signals BL0, BL1, and BL2, respectively. Lines 270, 271, and 272 can correspond to lines 170 of FIG. 1. Each of lines 270, 271, and 272 can be structured as a conductive line and can form part of a respective data line of memory device 200. Memory device 200 can include line 291, which can be structured as a conductive line and can form part of a source (e.g., a source line) of memory device 200. Line 291 can carry a signal, such as signal SRC (e.g., source line signal). Memory blocks $203_0$ and $203_1$ can share the same lines 270, 271, 272, and 291. FIG. 2A shows three lines (e.g., data lines) 270, 271, and 272 as an example. The number of such lines can vary.

Reset circuit 295 of memory device 200 can correspond to reset circuit 195 of FIG. 1. Reset circuit 295 can be configured to respond to signal RESET in order to apply (e.g., couple) certain voltages to some or all of lines 270, 271, 272, and 291 at specific time intervals in memory operations (e.g., read, write, and erase) of memory device 200, as described in more detail below with reference to FIG. 3 through FIG. 14.

As shown in FIG. 2A, memory blocks $203_0$ and $203_1$ can include similar or identical elements. Each of memory blocks $203_0$ and $203_1$ can include respective control gates 250, 251, 252, and 253 that can carry respective signals $WL0_0$, $WL1_0$, $WL2_0$, and $WL3_0$ and signals $WL0_1$, $WL1_1$, $WL2_1$, and $WL3_1$. Each of control gates 250, 251, 252, and 253 can form part of a respective access line of memory device 200 that can be similar to one of lines 150 of FIG. 1. FIG. 2A shows four control gates 250, 251, 252, and 253 in each of memory blocks $203_0$ and $203_1$ as an example. The number of such control gates can vary.

Each of memory blocks $203_0$ and $203_1$ can include memory cells 210, 211, 212, and 213 and transistors (e.g., select transistors) 261, 262, 263, and 264 that can be arranged in memory cell strings, such as memory cell strings 231, 232, and 233. For simplicity, in FIG. 2A, only three of the memory cell strings are labeled (231, 232, and 233).

Each of the memory cell strings (e.g., 231, 232, and 233) can include memory cells 210, 211, 212, and 213 and transistors (e.g., select transistors) coupled between line 291 and one of lines 270, 271, and 272. For example, memory cell string 231 can include memory cells 210, 211, 212, and 213, transistor 264 (immediately above memory cell 213), and transistor 262 (immediately below memory cell 210) coupled between line 291 and line 270.

Some memory cells in the same memory block can share the same control gate. For example, in memory blocks $203_0$, memory cells 210 can share the same control gate 250, memory cells 211 can share the same control gate 251.

FIG. 2A shows an example where each of memory blocks $203_0$ and $203_1$ can include six memory cell strings and four memory cells 210, 211, 212, and 213 in each memory cell string. The number of memory cell strings in a block and the number of memory cells in each memory cell string can vary.

As shown in FIG. 2A, in each of memory blocks $203_0$ and $203_1$, transistors 261 and 262 can be associated with (e.g., can share) the same select gate 280. Select gate 280 can form part of a select line (e.g., source select line) of memory device 200. Transistors 261 and 262 can be controlled (e.g., turned on or turned off) by the same signal, such as an $SGS_0$ signal or $SGS_1$ (e.g., source select gate signal) associated with select gate 280. For example, during a memory operation (e.g., such as a read or write operation) in memory blocks $203_0$, transistors 261 and 262 can be turned on (e.g., by activating signal $SGS_0$) to couple the memory cell strings of memory device 200 to a line 291. Transistors 261 and 262 can be turned off (e.g., by deactivating the $SGS_0$ signal) to decouple the memory cell strings of memory device 200 from line 291.

Transistors 263 and 264 in each of memory blocks $203_0$ and $203_1$ can be associated with separate select gates (e.g., drain select gates) 285 and 286. However, transistors 263 in the same memory block can be associated with the same select gate 285 (e.g., can share the same select gate 285) in that memory block. Transistors 264 in the same memory block can be associated with the same select gate 286 (e.g., can share the same select gate 286) in that memory block. Each of select gates 285 and 286 can form part of a respective select line (e.g., drain select line) of memory device 200.

Transistors 263 and 264 memory blocks $203_0$ and $203_1$ can be controlled (e.g., turned on or turned off) by corresponding signals (e.g., drain select gate signals) $SGD0_0$, $SGD1_0$, $SGD0_1$, $SGD1_1$, in order to selectively couple the memory cell strings of memory device 200 to their respective lines 270, 271, and 272, during a memory operation, such as a read or write operation. For example, during a memory operation, if memory block $203_0$ is selected, memory block $203_1$ is unselected, and memory cell string 231 is selected, then signal $SGD1_0$ can be activated to couple memory cell string 231 to line 270. Signal $SGD0_0$ can be deactivated to decouple the other memory cell strings (e.g., strings including transistors 261 and 263) from lines 270, 271, and 272. During a memory operation (e.g., a read or write operation), only one of memory blocks $203_0$ and $203_1$ can be selected at a time and only one of signals $SGD0_0$, $SGD1_0$, $SGD0_1$, $SGD1_1$ in the selected memory block can be activated at a time.

A selected memory block refers to the memory block that has at least one memory cell selected to store information in that memory cell (e.g., in a write operation) or to obtain information stored in that memory cell (e.g., in a read operation). A selected memory cell string refers to the memory cell string that includes the selected memory cell. An unselected memory cell string refers to the memory cell string having no selected memory cells. An unselected memory block refers to the memory block having no selected memory cells.

FIG. 2B shows a side view of a structure of a portion of memory device 200 of FIG. 2A, according to an embodiment of the invention. As shown in FIG. 2B, memory device 200 can include a substrate 290 where memory cell string 231 can be formed over substrate 290. Substrate 290 can include a semiconductor material (e.g., silicon). Other memory cell strings of memory device 200 have structures similar to the structure of memory cell string 231.

As shown in FIG. 2B, memory cells 210, 211, 212, and 213 can be located in different levels 221, 222, 223, and 224, respectively, in a z-direction of device 200. The z-direction can extend in a direction associated with the thickness of substrate 290. FIG. 2B also shows an x-direction, which is perpendicular to the z-direction.

Memory cell string 231 can include a body 240 coupled to line 270. Line 270 can include a conductive material (e.g., conductively doped polycrystalline silicon or other conductive material). Body 240 can include portion 241 coupled to line 270, a portion 242 coupled to line 291, and a portion 243 between portions 241 and 242. Body 240 can have a pillar structure extending outwardly from substrate 290 in the z-direction. Body 240 can include a conductive material that is capable of providing a conduction of current between lines 270 and 291. Portions 241 and 242 can include materials of the same conductivity type. Portion 243 can include a material of conductivity type different from that of portions 241 and 242. For example, portions 241 and 242 can include a semiconductor material of n-type, and portion 243 can include a semiconductor material of p-type. In another example, portions 241 and 242 can include a semiconductor material of p-type, and portion 243 can include a semiconductor material of n-type. The semiconductor materials in portions 241, 242, and 243 can include polycrystalline silicon.

As shown in FIG. 2B, portions 241 and 243 can directly contact each other and form a junction (e.g., p-n junction) 244. Portions 242 and 243 can directly contact each other and form a junction (e.g., p-n junction) 245. Each of junctions 244 and 245 can enable a flow of electrons or holes across the junction.

Each of memory cells 210, 211, 212, and 213 can surround or partially surround the body 240. Control gates 250, 251, 252, and 253 associated with memory cells 210, 211, 212, and 213 can be located along body 240 in the z-direction. Each of control gates 250, 251, 252, and 253 can surround or partially surround body 240. The materials of control gates 250, 251, 252, and 253 can include a conductive material (e.g., conductively doped polycrystalline silicon or other conductive material).

Memory cell string 231 can include materials 203, 204, and 205 between body 240 and each of control gates 250, 251, 252, and 253. Material 205 can also be between body 240 and each of select gates 280 and 286. Materials 203, 204, and 205 can be separated (e.g., in the z-direction) among memory cells 210, 211, 212, and 213.

Material 203 can include a charge blocking material(s) (e.g., a dielectric material such as silicon nitride) that is capable of blocking a tunnel of a charge (e.g., electrons).

Material 204 can include a charge storage (e.g., charge trap) material(s) that can provide a charge storage function to represent a value of information stored in memory cell 210, 211, 212, or 213. For example, material 204 can include conductively doped polycrystalline silicon, which can be either a p-type polycrystalline silicon or an n-type polycrystalline silicon. The polycrystalline silicon can be configured to operate as a floating gate (e.g., to store charge) in a memory cell (e.g., memory cell 210, 211, 212, or 213). In another example, material 204 can include a charge trap material(s) such as silicon nitride.

Material 205 can include a tunnel dielectric material(s) (e.g., an oxide of silicon) that is capable of allowing tunneling of a charge (e.g., electrons).

Line 291 can be formed over a portion of substrate 290. Line 291 and portion 242 of body 240 can include materials of the same conductivity type. FIG. 2B shows line 291 formed over substrate 290 (e.g., formed as separate layer) as an example. Alternatively, line 291 can be formed in a portion of substrate 290. For example, line 291 can be formed as a doped region in substrate 290.

Figure 3:
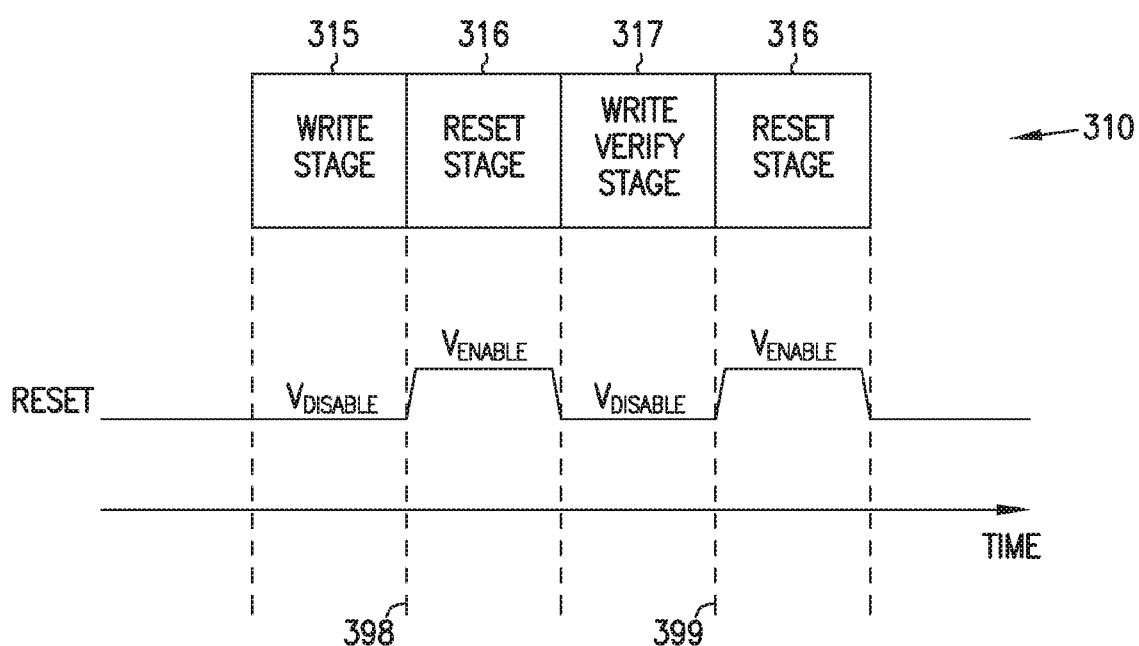
FIG. 3 shows a diagram illustrating different stages of a write operation of the memory device of FIG. 2A and FIG. 2B, according to an embodiment of the invention.

FIG. 3 shows a diagram illustrating a write stage 315, a reset stage 316, a write verify stage 317, and another reset stage 316 of a write operation 310 of memory device 200 of FIG. 2A and FIG. 2B, according to an embodiment of the invention. The following description refers to FIG. 2A, FIG. 2B, and FIG. 3. Memory device 200 can perform write stage 315, reset stage 316, write verify stage 317, and reset stage 316 in a sequential order with respect to time (as shown in FIG. 3). In write stage 315, memory device 200 (FIG. 2A) can store information in a selected memory cell among memory cells 210, 211, 212, and 213 of a memory cell string, such as memory cell string 231. In write verify stage 317 (FIG. 3), memory device 200 can determine whether the value of information stored in the selected memory cell (stored by write stage 315) reaches a target value. The target value refers to a value of information intended to be stored in a selected memory cell. The value of information stored in a selected memory cell can be based on a state (e.g., threshold voltage) of the selected memory cell.

Reset stage 316 can be performed during a time interval between write stage 315 and write verify stage 317 and/or can also be performed after write verify stage 317. For example, memory device 200 can be configured to bypass reset stage 316 in write operation 310. However, as described in more detail below with reference to FIG. 5 and FIG. 6, including reset stage 316 in write operation 310 (FIG. 3) may improve the reliability of memory device 200.

As shown in FIG. 3, signal RESET can have different levels (e.g., associated with different voltages) $V_{DISABLE}$ and $V_{ENABLE}$. Level $V_{DISABLE}$ can have a value (e.g., zero volts) less the value of level $V_{ENABLE}$. Memory device 200 can be configured to perform reset stage 316 when signal RESET has level $V_{ENABLE}$. Memory device 200 (FIG. 2A) can be configured to bypass reset stage 316 (between write stage 315 and write verify stage 317) and perform write verify stage 317 immediately after write stage 315 if signal RESET has level $V_{DISABLE}$ during a time interval between stages 315 and 317. For example, if signal RESET has the same level $V_{DISABLE}$ from time 398 to time 399, then reset stage 316 can be bypassed. Alternatively or additionally, memory device 200 can be configured to bypass reset stage 316 after write verify stage 317 is performed. For example, if signal RESET has the same level $V_{DISABLE}$ after time 399, then reset stage 316 after time 399 can be bypassed.

Figure 4:
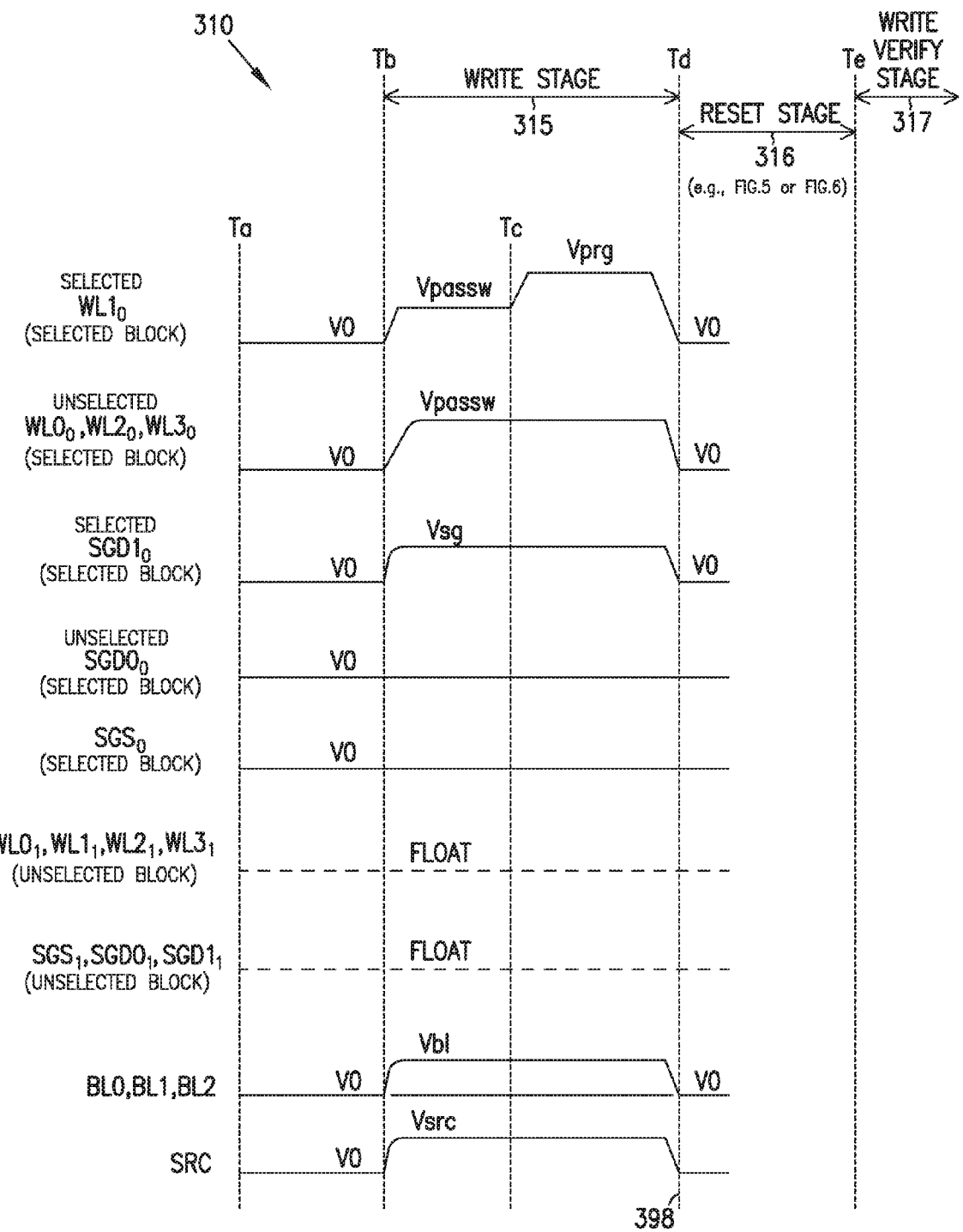
FIG. 4 is a timing diagram showing waveforms of some of the signals of the memory device of FIG. 2A and FIG. 2B during the write operation shown in FIG. 3, according to an embodiment of the invention.

FIG. 4 is a timing diagram showing waveforms of some of the signals of memory device 200 of FIG. 2A and FIG. 2B during write operation 310 of FIG. 3, according to an embodiment of the invention. In FIG. 4, stages 315, 316, and 317 correspond to those shown in FIG. 3. The signals (e.g., $WL0_1$, $WL1_1$, $WL2_1$, and $WL3_1$) in FIG. 4 correspond to the same signals shown in FIG. 2A. The following description refers to FIG. 2A, FIG. 2B, FIG. 3, and FIG. 4.

In write operation 310 (FIG. 3 and FIG. 4), memory block $203_0$ (FIG. 2A) is assumed to be a selected memory block and memory block $203_1$ is assumed to be an unselected memory block. Memory cell 211 of memory cell string 231 is assumed to be a selected memory cell. Thus, memory cell string 231 can be a selected memory cell string. Control gate 251 of the selected block (associated with signal $WL1_0$) can be a selected control gate. Control gates 250, 252, and 253 of the selected block (associated with signals $WL0_0$, $WL2_0$, and $WL3_0$) can be unselected control gates. Select gate 286 of the selected block (associated with corresponding signal $SGD1_0$) can be a selected select gate. Select gate 285 of the selected block (associated with signal $SGD0_0$) can be an unselected select gate. Select gate 280 of the selected block (associated with signal $SGS_0$) can be a selected select gate. In memory block $203_1$, control gates 250, 251, 252, and 253, (associated with signals $WL0_1$, $WL1_1$, $WL2_1$, and $WL3_1$) can be unselected control gates. Select gates 280, 285, and 286 of an unselected block (associated with signals $SGS_1$, $SGD0_1$, and $SGD1_1$) can be unselected select gates.

As shown in FIG. 4, write stage 315 can be performed during a time interval between times Tb and Td to store information in the selected memory cell. Reset stage 316 can be performed during a time interval between times Td and Te. Write verify stage 317 can be performed after time Te.

In write stage 315, memory device 200 can apply a voltage Vpassw to control gate 251 of the selected block (associated with signal $WL1_0$) during a time interval between time Tb and Tc and a voltage Vprg (e.g., a programming voltage) to control gate 251 of the selected block during a time interval between times Tc and Td. The voltage on line 251 of the selected block can be at a voltage V0 between times Ta and Tb. Voltage V0 can have a value of zero volts (e.g., ground potential). Each of voltages Vpassw and Vprg can have a positive value greater than that of voltage V0. The value of voltage Vprg can be greater than the value of voltage Vpassw.

Memory device 200 can apply voltage Vpassw to control gates 250, 252, and 253 of the selected block (associated with signals $WL0_0$, $WL2_0$, and $WL3_0$) during a time interval between time Tb and Td. The voltage on control gates 250, 252, and 253 of the selected block can be at voltage V0 between times Ta and Th.

Memory device 200 can apply a voltage Vsg to select gate 286 of the selected block (associated with signals $SGD1_0$) during a time interval between time Tb and Td. The voltage on select gate 286 of the selected block can be at voltage V0 between times Ta and Th. Voltage Vsg can have a positive value.

Memory device 200 can apply voltage V0 to select gates 280 and 285 of the selected block (associated with signals $SGS_0$ and $SGD0_0$) during a time interval between time Ta and Td.

The voltage on lines 270, 271, and 272 (associated with signals BL0. BL1, and BL2 in FIG. 4) can be at voltage Vb1 or voltage V0, depending on the value of information to be stored in the selected memory cell. Memory device 200 can apply a voltage Vsrc to line 291 (associated with signal SRC) during a time interval between time Tb and Td. Voltage Vsrc can have a positive value. For example, voltage Vsrc can have a value equal to the supply voltage (e.g., Vcc) of memory device 200.

With respect to an unselected block, the waveform of signals $WL0_1$, $WL1_1$, $WL2_1$, $WL3_1$ are shown in dashed lines to indicate that corresponding control gates 250, 251, 252, and 253 (of the unselected block) can be in a float condition (e.g., electrically unconnected to another element). Similarly, signals $SGS_1$, $SGD0_1$, and $SGD1_1$ are shown in dashed lines to indicate that corresponding select gates 280, 285, and 286 of the unselected block can be in a float condition.

In write stage 315, in selected memory block $203_0$, the potentials of body 240 (FIG. 2B) of memory cell string 231 (selected) and unselected memory cell strings that share the same control gates 250, 251, 252, and 253 with memory cell string 231 may fall to a negative potential (e.g., −5 volts) at the end of write stage 315 (e.g., at time 398 in FIG. 4). The negative potential may cause undesirable situations in memory block $203_0$ and may affect other operations (e.g., write verify stage 317) performed on memory block $203_0$. The undesirable situations may include a gate stress situation and a hot electron injection situation.

Gate stress situation may occur in a particular memory cell (e.g., one of memory cells 210, 211, 212, and 213 in FIG. 2B) that has a relatively low threshold voltage. The gate stress in a particular memory cell may create a favorable condition for excess electrons from body 240 (due to the negative potential) to move (e.g., by tunneling) from body 240 to charge storage material 204 (e.g., floating gate) of that particular memory cell.

Hot electron injection situation may occur near both ends of body 240 (e.g., ends close to memory cells 210 and 213 in FIG. 2B). The electric field at these ends of body 240 may be relatively high. Excess electrons from body 240 (due to the negative potential) may leak from body 240 at these ends and become hot electrons. In some cases, for example, in cases where particular memory cells near these ends (e.g., memory cells 210 and 213) have a relatively low threshold voltage, the hot electrons may be injected into charge storage material 204 of these particular memory cells.

The gate stress and hot electron injection situations, as described above, may alter (e.g., increase) the threshold voltage of one or more of memory cells 210, 211, 212, and 213. Thus, the values of information (which can be based on the threshold voltage values) stored in memory cells 210, 211, 212, and 213 may deviate from their intended values. As a result, errors in the information stored in memory cells 210, 211, 212, and 213 may occur. Reset stage 316 (FIG. 3 and FIG. 4) may be performed to control (e.g., increase) the potential of body 240 during at least a portion of the reset stage 316. Reset stage 316 may reset body 240 from a negative potential (e.g., −5V) to zero or near zero volts by the end of reset stage 316. As a result, the mentioned gate stress situation and hot electron injection situations may be avoided. This may improve the reliability of memory device 200.

Figure 5:
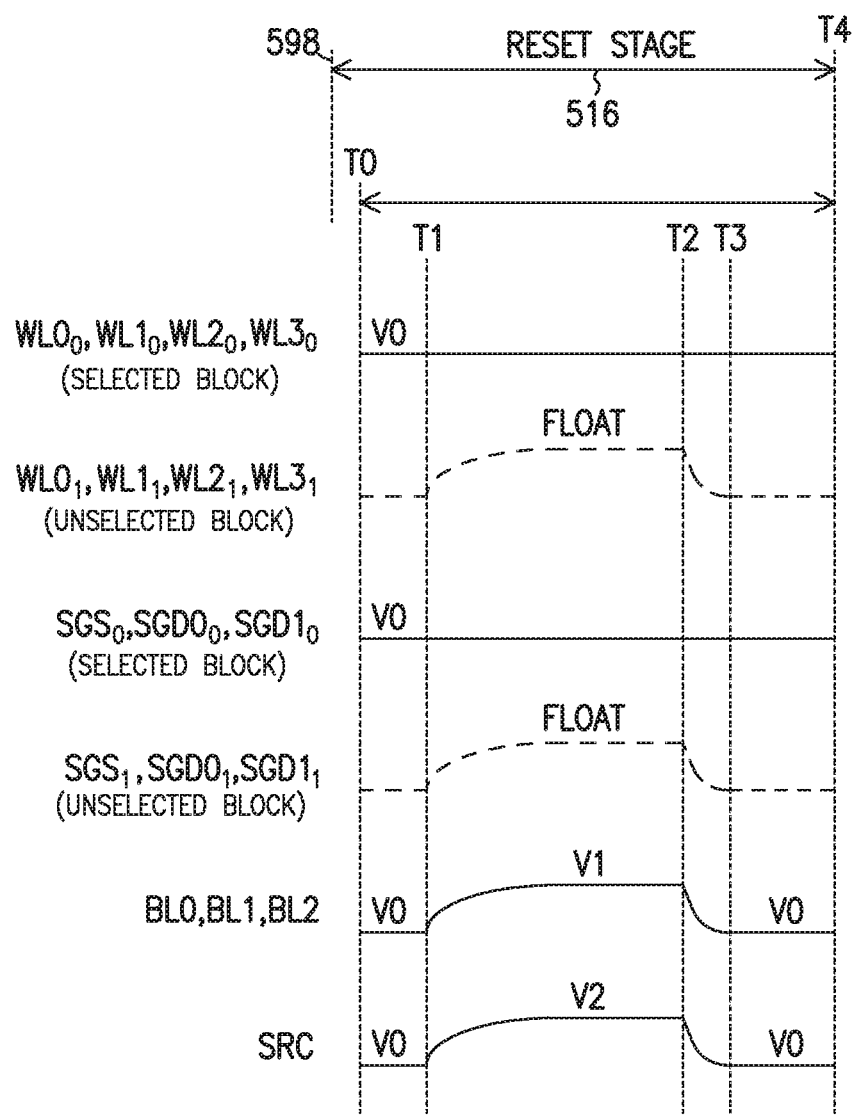
FIG. 5 is a timing diagram showing waveforms of some of the signals of the memory device of FIG. 2A and FIG. 2B during a reset stage, according to an embodiment of the invention.
Figure 6:
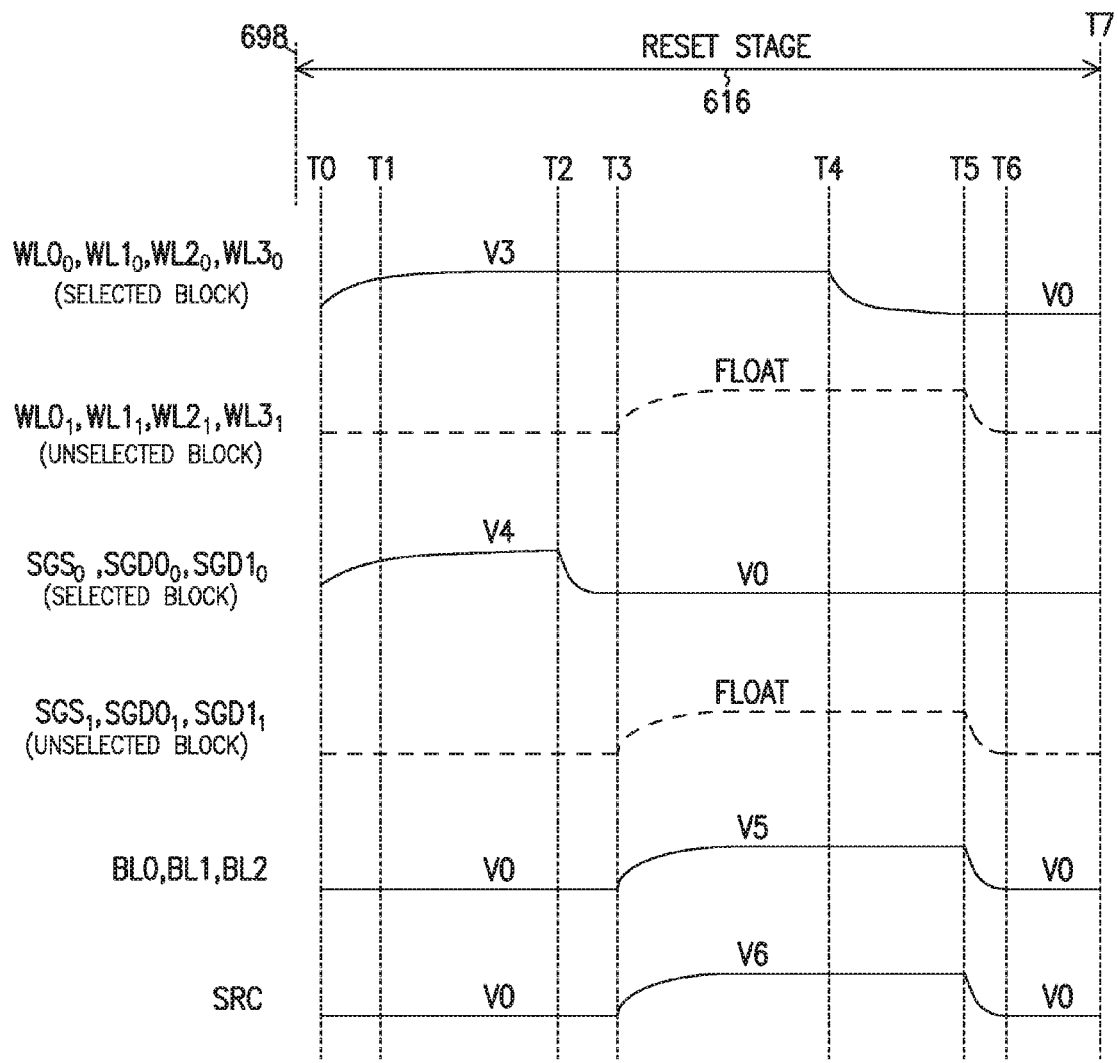
FIG. 6 is a timing diagram showing waveforms of some of the signals of the memory device of FIG. 2A and FIG. 2B during an alternative reset state, according to an embodiment of the invention.

Reset stage 316 can include either the reset stage 516 (FIG. 5) or reset stage 616 (FIG. 6). Write verify stage 317 can include a read stage, such as read stage 1015 described below with reference to FIG. 10, FIG. 11A, and FIG. 11B or read stage 1235 described below with reference to FIG. 12.

FIG. 5 is a timing diagram showing waveforms of some of the signals of memory device 200 of FIG. 2A and FIG. 2B during a reset stage 516. according to an embodiment of the invention. Reset stage 516 can correspond to reset stage 316 of FIG. 4. Thus, the waveforms associated with reset stage 516 in FIG. 5 can be used for the reset stage 316 in FIG. 4.

As shown in FIG. 5, reset stage 516 can begin at time 598 and end at time T4. Time 598 can correspond to time 398 (the end of write stage 315) in FIG. 4. The following description refers to FIG. 2A through FIG. 5.

As described above, body 240 (FIG. 2B) can have a negative potential at the end of write stage 315 (FIG. 3 and FIG. 4). A lack of holes in body 240 can be one of the factors that may cause the negative potential to occur. Memory device 200 can perform reset stage 516 to generate gate-induced drain leakage (GIDL) current at one or both of junctions 244 and 245 (FIG. 2B) of body 240. Holes can be generated by the GIDL current. Memory device 200 can control the potential of body 240, such as by injecting holes (generated from GIDL current) into body 240 in order to increase the potential of body 240, thereby removing or minimizing the negative potential in body 240.

GIDL current can be induced in at junction 244 of body 240 (FIG. 2B) when the value of the voltage on line 270 is higher than the value of the voltage on select gate 286. GIDL current can be induced in at junction 245 of body 240 when the value of the voltage on line 291 is higher than the value of the voltage on select gate 280.

Thus, by applying appropriate voltages to lines 270, 271, 272, 291 and select gates 280, 285, and 286, memory device 200 can induce GIDL current in the body (e.g., body 240) of memory cell string 231 (selected) and unselected memory cell strings in memory block $203_0$ (FIG. 2A).

For example, between times T1 and T2 in FIG. 5, memory device 200 can apply voltage V1 to lines 270, 271, and 272 (associated with signals BL0, BL1, and BL2), voltage V2 to line 291 (associated with signal SRC), and voltage V0 to select gates 280, 285, and 286 of the selected block (associated with signals $SGS_0$, $SGD0_0$, and $SGD1_0$). At time T2, voltage V1 can be decreased such that it can reach voltage V0 by the end of reset stage 516 (e.g., between times T3 and T4). Similarly, voltage V2 can be decreased such that it can reach voltage V0 by the end of reset stage 516.

Each of voltages V1 and V2 can have a positive value and can be greater than the value of voltage V0. The values of voltages V1 and V2 can be the same or different. For example, the value of voltage V1 can be equal to, less than, or greater than the value of voltage V2. With these applied voltages, GIDL current can be generated to provide holes to body 240. Voltage V0 applied to select gates 280, 285, and 286 of the selected block between times T1 and T2 can be zero volts. Alternatively, a voltage having a positive value can be applied to select gates 280, 285, and 286 of the selected block between times T1 and T2 as long as such positive value is less than the value of voltage V1 and V2, so that GIDL current can occur at junction 244 or 245 or both (FIG. 2B) to provide holes to body 240 between times T1 and T2.

Thus, in reset stage 516, memory device 200 can increase the voltage on lines 270, 271, and 272 from voltage V0 (at time T0) to voltage V1, hold lines 270, 271, and 272 at voltage V1 and hold select gates 280, 285, and 286 of the selected block at voltage V0 for a time interval (e.g., between times T1 and T2) to induce GIDL current (e.g., at junction 244 in FIG. 2B). In a similar fashion, in reset stage 516, memory device 200 can increase the voltage on line 291 from voltage V0 to voltage V2 and hold line 291 at voltage V2 for a time interval to induce GIDL current (e.g., at junction 245 in FIG. 2B).

Between times T0 and T4, control gates 250, 251, 252, and 253 (associated with signals $WL0_0$, $WL1_0$, $WL2_0$, and $WL3_0$) in memory block $203_0$ can be applied with voltage V0. In memory block $203_1$, control gates 250, 251, 252, and 253 (associated with signals $WL0_1$, $WL1_1$, $WL2_1$, and $WL3_1$) and select gates 280, 285, and 286 (associated with signals $SGS_1$, $SGD0_1$, and $SGD1_1$) can be put in a float condition.

FIG. 5 shows an example where memory device 200 can increase the voltage on lines 270, 271, 272, (e.g., from voltage V0 to voltage V1) and also on line 291 (e.g., from voltage V0 to voltage V2). However, memory device 200 can be configured to increase either the voltage on line 291 or the voltage on lines 270, 271, and 272. For example, between times T1 and T2, memory device 200 can increase the voltage on lines 270, 271, and 272 (e.g., from voltage V0 to voltage V1) and hold line 291 at the same voltage V0 from time T0 to time T2. In another example, memory device 200 can increase the voltage on line 291 (e.g., from voltage V0 to voltage V2) and hold lines 270, 271, and 272 at the same voltage V0 from time T0 to time T2.

FIG. 6 is a timing diagram showing waveforms of some of the signals of memory device 200 of FIG. 2A and FIG. 2B during a reset stage 616 in which a voltage on at least one of the control gates has a positive value, according to an embodiment of the invention. Memory device 200 can be configured to perform reset stage 616 as an alternative for reset stage 516 of FIG. 5. Reset stage 616 can correspond to reset stage 316 of FIG. 4. Thus, the waveforms associated with reset stage 616 in FIG. 6 can be used for the reset stage 316 in FIG. 4.

As shown in FIG. 6, reset stage 616 can begin at time 698 and end at time T7. Time 698 can correspond to time 398 (the end of write stage 315) of FIG. 4. Similar to reset stage 516 of FIG. 5, memory device 200 can perform reset stage 616 to induce GIDL current at one or both of junctions 244 and 245 (FIG. 2B) of body 240 to control the potential of body 240, such as by injecting holes (generated from GIDL current) into body 240 in order to increase the potential of body 240, thereby removing or minimizing the negative potential in body 240.

In reset stage 616, however, memory device 200 can apply a voltage V3 having a positive value to control gates 250, 251, 252, and 253 of the selected block (associated with signals $WL0_0$, $WL1_0$, $WL2_0$, and $WL3_0$) for at least a portion of time interval between times T0 and T7. For example, memory device 200 can apply voltage V3 to control gates 250, 251, 252, and 253 of the selected block between times T3 and T4 while it applies voltage V5 to lines 270, 271, and 272 (associated with signals BL0, BL1, and BL2) and voltage V6 to line 291 (associated with signal SRC). Applying the voltages (e.g., V3, V5, and V6) this way may reduce the voltage difference and the electric field at regions between body 240 and lines 270, 271, 272, and 291 (FIG. 2B).

Between times T0 and T3 in FIG. 6, select gates 280, 285, and 286 of the selected block (associated with signals $SGS_0$, $SGD0_0$, and $SGD1_0$) can be applied with a voltage V4 (having a positive value). At time T2, voltage V4 can be decreased such that it can reach voltage V0 by time T3 and remain at voltage V0 from time T3 to time T7.

At time T4, voltage V3 on control gates 250, 251, 252, and 253 of the selected block can be decreased such that it can reach voltage V0 by time T5 and remain at voltage V5 from time T5 to time T7.

At time T5, voltage V5 on lines 270, 271, and 272 can be decreased such that it can reach voltage V0 by the end of reset stage 616 (e.g., between times T6 and T7). Similarly, at time T5, voltage V6 on line 291 can be decreased such that it can reach voltage V0 by the end of reset stage 616.

The values of voltages V5 and V6 can be the same or different. For example, the value of voltage V5 can be equal to, less than, or greater than the value of voltage V6. Voltage V0 applied to select gates 280, 285, and 286 of the selected block between times T3 and T5 can be zero volts. Alternatively, a voltage having a positive value can be applied to select gates 280, 285, and 286 of the selected block between times T3 and T5 as long as such positive value is less than the value of voltage V5 and V6, so that GIDL current can occur at junction 244 or 245 or both (FIG. 2B) to provide holes to body 240 between times T3 and T5.

Thus, in reset stage 616, memory device 200 can increase the voltage on lines 270, 271, and 272 from voltage V0 (at time T0) to voltage V5, hold lines 270, 271, and 272 at voltage V5 and hold select gates 280, 285, and 286 of the selected block at voltage V0 for a time interval (e.g., between times T3 and T5) to induce GIDL current (e.g., at junction 244 in FIG. 2B). In a similar fashion, in reset stage 616, memory device 200 can increase the voltage on line 291 from voltage V0 to voltage V6 and hold line 291 at voltage V6 for a time interval to induce GIDL current (e.g., at junction 245 in FIG. 2B).

FIG. 6 shows an example where memory device 200 can increase the voltage on lines 270, 271, 272 and 291 (e.g., from voltage V0 to voltage V5 or V6). However, memory device 200 can increase the voltage on only line 291 or the voltage on only lines 270, 271, and 272. For example, between times T3 and T5, memory device 200 can increase the voltage on only lines 270, 271, and 272 (e.g., from voltage V0 to voltage V5) and hold line 291 at the same voltage V0 from time T0 to time T7. In another example, memory device 200 can increase the voltage on only line 291 (e.g., from voltage V0 to voltage V6) and hold lines 270, 271, and 272 at the same voltage V0 from time T0 to time T7.

Figure 7:
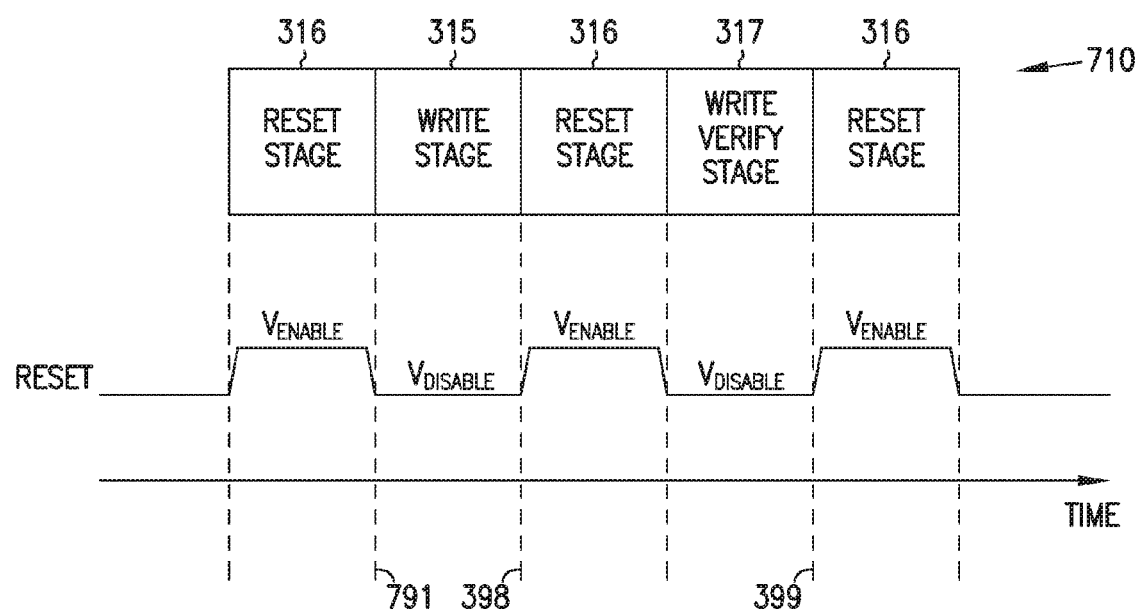
FIG. 7 shows a diagram illustrating different stages of an alternative write operation of the memory device of FIG. 2A and FIG. 2B, according to an embodiment of the invention.

FIG. 7 shows a diagram illustrating a write operation 710 of memory device 200 of FIG. 2A and FIG. 2B, according to an embodiment of the invention. Memory device 200 can be configured to perform write operation 710 as an alternative for write operation 310 (FIG. 3 and FIG. 4). In FIG. 7, write operation 710 can include stages (e.g., 315, 316, and 317) similar to or identical to those of write operation 310 (FIG. 3). For simplicity, description of similar or identical elements between write operations 310 and 710 is not repeated in the description of FIG. 7.

As shown in FIG. 7, reset stage 316 can be performed immediately before and/or after write stage 315. For example, before time 791 at the beginning of write stage 315, a reset stage 316 can be performed. Then, another reset stage 316 can be performed at the end of write stage 315 (e.g., at time 398). In some cases in memory device 200, body 240 (FIG. 2B) may have negative potential before time 791 (e.g., before write stage 315 is performed). Performing reset stage 316 before time 791 may remove excess electrons from body 240 in order to increase the potential of body 240 (e.g., increase from a negative potential to about zero volts). This could improve the operation of write stage 315, such as by avoiding voltage boosting failure that may occur in body 240 during write stage 315.

Figure 8:
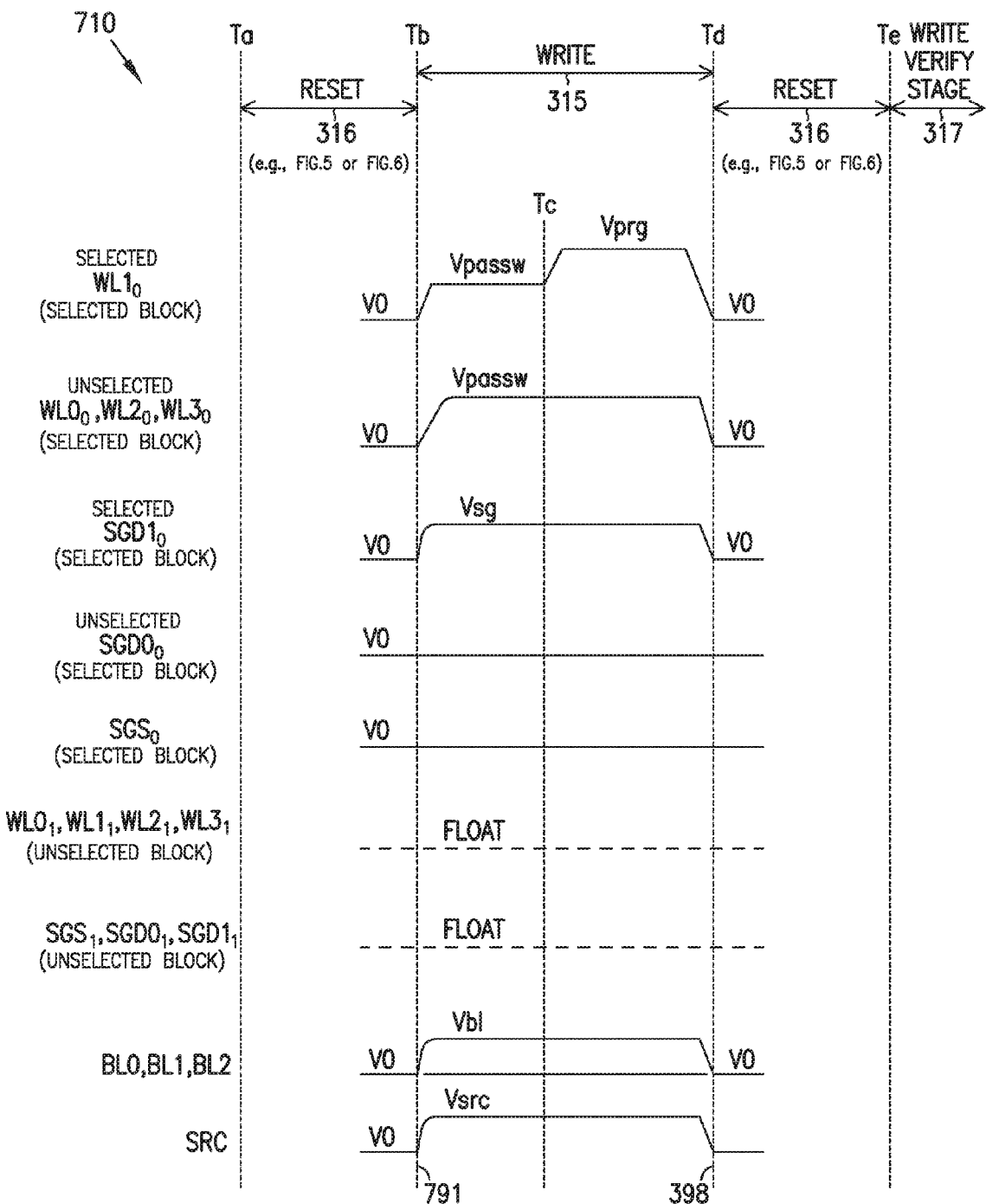
FIG. 8 is a timing diagram showing waveforms of some of the signals of the memory device of FIG. 2A and FIG. 2B during the write operation shown in FIG. 7, according to an embodiment of the invention.

FIG. 8 is a timing diagram showing waveforms of some of the signals of memory device 200 of FIG. 2A and FIG. 2B during write operation 710 of FIG. 7, according to an embodiment of the invention. The waveforms in FIG. 8 can be similar to or identical to those in FIG. 4, except for the waveforms associated with reset stage 316 (between times Ta and Th) performed before write stage 315 is performed (e.g., before time 791). As shown in FIG. 8, the waveforms associated with reset stage 316 between times Ta and Tb can be similar or identical to those shown in FIG. 5 or FIG. 6.

Figure 9:
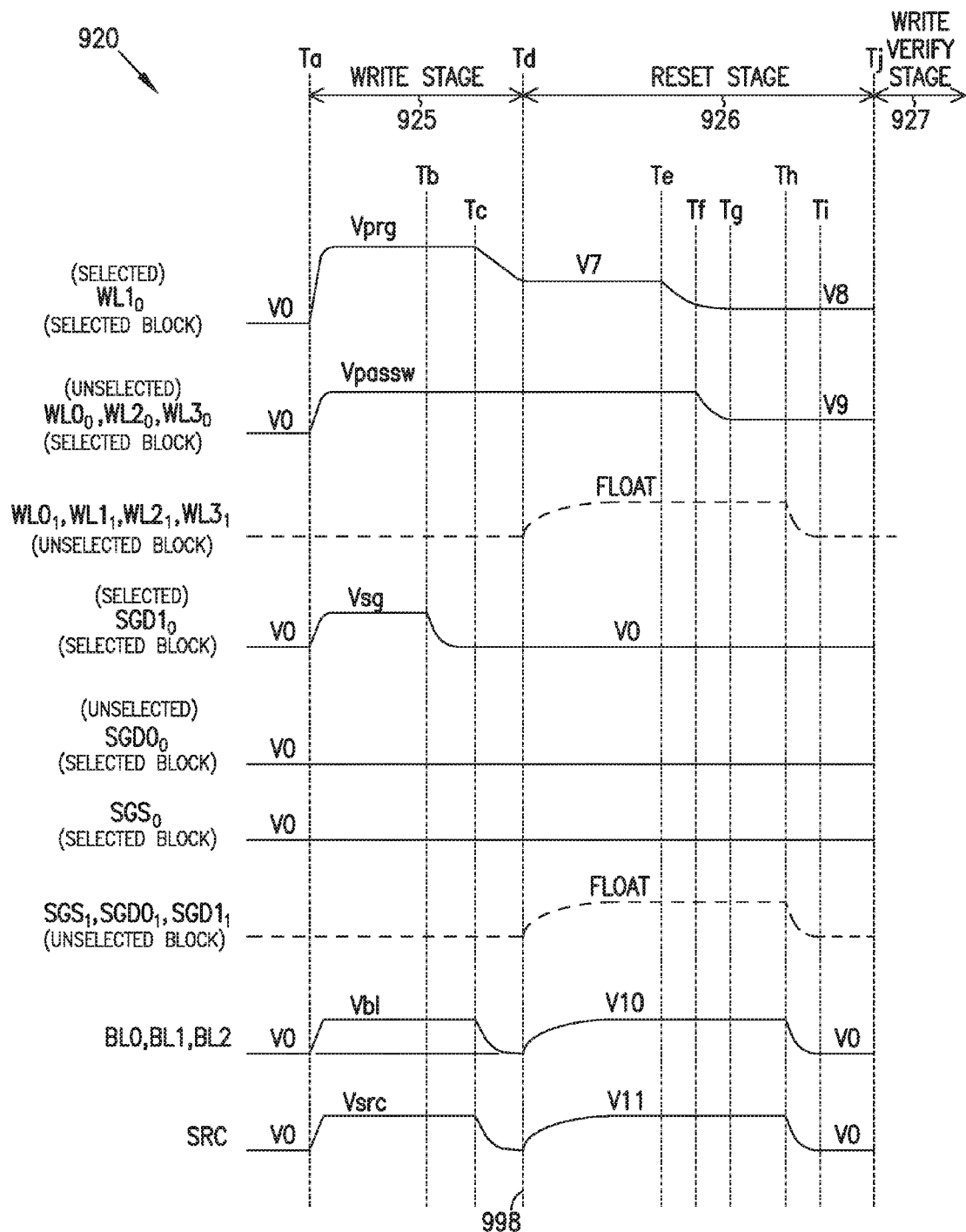
FIG. 9 is a timing diagram showing waveforms of some of the signals of the memory device of FIG. 2A and FIG. 2B during another alternative write operation, according to an embodiment of the invention.

FIG. 9 is a timing diagram showing waveforms of some of the signals of memory device 200 of FIG. 2A and FIG. 2B during a write operation 920, according to an embodiment of the invention. Memory device 200 can be configured to perform write operation 920 (FIG. 9) as an alternative for write operation 310 (FIG. 3 and FIG. 4) or write operation 710 (FIG. 7 and FIG. 8).

In FIG. 9, write stage 925 can store information in a selected memory cell among memory cells 210, 211, 212, and 213 of a memory cell string, such as memory cell string 231. Write verify stage 927 can determine whether the value of information stored in the selected memory cell (stored by write stage 925) reaches a target value. Reset stage 926 can be performed to control the potential of body 240, such as by injecting holes (e.g., generated by GIDL current) into body 240 in order to increase the potential of body 240, thereby removing or minimizing the negative potential in body 240 present at the end of write stage 925.

In write stage 925, memory device 200 can apply voltage Vprg to control gate 251 of the selected block (associated with signal $WL1_0$) between times Ta and Tc, voltage Vpassw to control gates 250, 252, and 253 of the selected block (associated with signals $WL0_0$, $WL2_0$, and $WL3_0$) between time Ta and Tf, and voltage Vsg to select gate 286 of the selected block between times Ta and Tb. Memory device 200 can apply voltage V0 to select gates 280 and 285 of the selected block (associated with signals $SGS_0$ and $SGD0_0$) between times Ta and Tj.

At time Tc, voltage Vprg can be decreased such that it can reach voltage V7 by time Td. Voltage V7 can have a positive value. At time Tb, voltage Vsg can be decreased such that it can reach voltage V0 by time Tc and remain at voltage V0 from time Tc to time Tj.

In write stage 925, the voltage on lines 270, 271, and 272 (associated with signals BL0, BL1, and BL2) can be at voltage Vb1 or voltage V0, depending on the value of information to be stored in the selected memory cell. Memory device 200 can apply a voltage Vsrc to line 291 (associated with signals SRC) during a time interval between time Ta and Td.

Control gates 250, 251, 252, and 253 (associated with signals $WL0_1$, $WL1_1$, $WL2_1$, and $WL3_1$) and select gates 280, 285, and 286 (associated with signals $SGS_1$, $SGD0_1$, and $SGD1_1$) of the unselected block can be put in a float condition.

At the end of write stage 925 (e.g., at time 998), the potentials of body 240 (FIG. 2B) of memory cell string 231 (selected) and unselected memory cell strings that share the same control gates 250, 251, 252, and 253 with memory cell string 231 may fall to a negative potential. Reset stage 926 can be performed to inject holes (e.g., generated by GIDL current) into body 240.

In reset stage 926, memory device 200 can hold the voltage on control gate 251 of the selected block at V7 from time Td to time Te and hold the voltage on control gates 250, 252, and 253 of the selected block at Vpassw from time Td to time Tf. At time Te, voltage Vprg on control gate 251 of the selected block can be decreased such that it can reach voltage V8 by time Tg. The voltage on control gate 251 of the selected block can remain at voltage V8 through the end of reset stage (e.g., between times Ti and Tj). At time Tf, voltage Vpassw on control gates 250, 252, and 253 of the selected block can be decreased such that it can reach voltage V9 by time Tg. The voltage on control gates 250, 252, and 253 can remain at voltage V9 through the end of reset stage 926 (e.g., between times Ti and Tj).

Each of voltages V8 and V9 can have a positive value. The values of voltages V8 and V9 can be the same or different. For example, the value of voltage V8 can be equal to, less than, or greater than the value of voltage V9. Alternatively, one or both of voltages V8 and V9 can be zero volts. However, using voltages V8 and V9 with positive values may reduce power consumed by memory device 200 when it performs write verify stage 927 after reset stage 926.

In reset stage 926, memory device 200 can increase the voltage on lines 270, 271, and 272 from voltage V0 (at time Td) to voltage V10 and hold lines 270, 271, and 272 at voltage V10 for a time interval (e.g., between times Td and Th) to induce GIDL current (e.g., at junction 244 in FIG. 2B). At time Th, voltage V10 can be decreased such that it can reach voltage V0 by the end of reset stage 926 (e.g., between times Ti and Tj). In a similar fashion, in reset stage 926, memory device 200 can increase the voltage on line 291 from voltage V0 to voltage V11 and hold line 291 at voltage V1 for a time interval to induce GIDL current (e.g., at junction 245 in FIG. 2B). Then, voltage V11 can be decreased such that it can reach voltage V0 by the end of reset stage 926.

Each of voltages V10 and V11 can have a positive value. The values of voltages V10 and V11 can be the same or different. For example, the value of voltage V10 can be equal to, less than, or greater than the value of voltage V11. Voltage V0 applied to select gates 280, 285, and 286 of the selected block between times Td and Th can be zero volts. Alternatively, a voltage having a positive value can be applied to select gates 280, 285, and 286 of the selected block between times Td and Th as long as such positive value is less than the value of voltage V10 and V11, so that GIDL current can occur at junction 244 or 245 or both (FIG. 2B) to provide holes to body 240 between times Td and Th.

Figure 10:
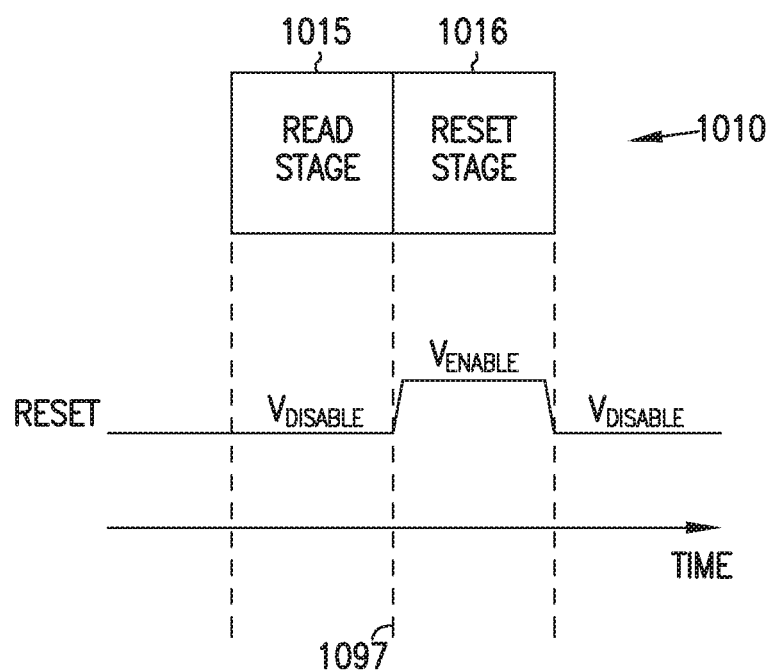
FIG. 10 shows a diagram illustrating different stages of read operation of the memory device of FIG. 2A and FIG. 2B, according to an embodiment of the invention.

FIG. 10 shows a diagram illustrating a read stage 1015 and a reset stage 1016 of a read operation 1010 of memory device 200 of FIG. 2A and FIG. 2B, according to an embodiment of the invention. The following description refers to FIG. 2A, FIG. 2B, and FIG. 10. In read stage 1015, memory device 200 (FIG. 2A) can determine (e.g., read) the value of information stored in a selected memory cell among memory cells 210, 211, 212, and 213 of a memory cell string, such as memory cell string 231. Reset stage 1016 can be performed at the end of read stage 1015 (e.g., at time 1097). As shown in FIG. 10, memory device 200 can be configured to perform reset stage 1016 when signal RESET has level VENABLE. Memory device 200 can be configured to bypass reset stage 1016 in read operation 1010. However, as described in more detail below with reference to FIG. 11A and FIG. 11B, including reset stage 1016 in read operation 1010 (FIG. 10) may improve the reliability memory device 200.

Figure 11A:
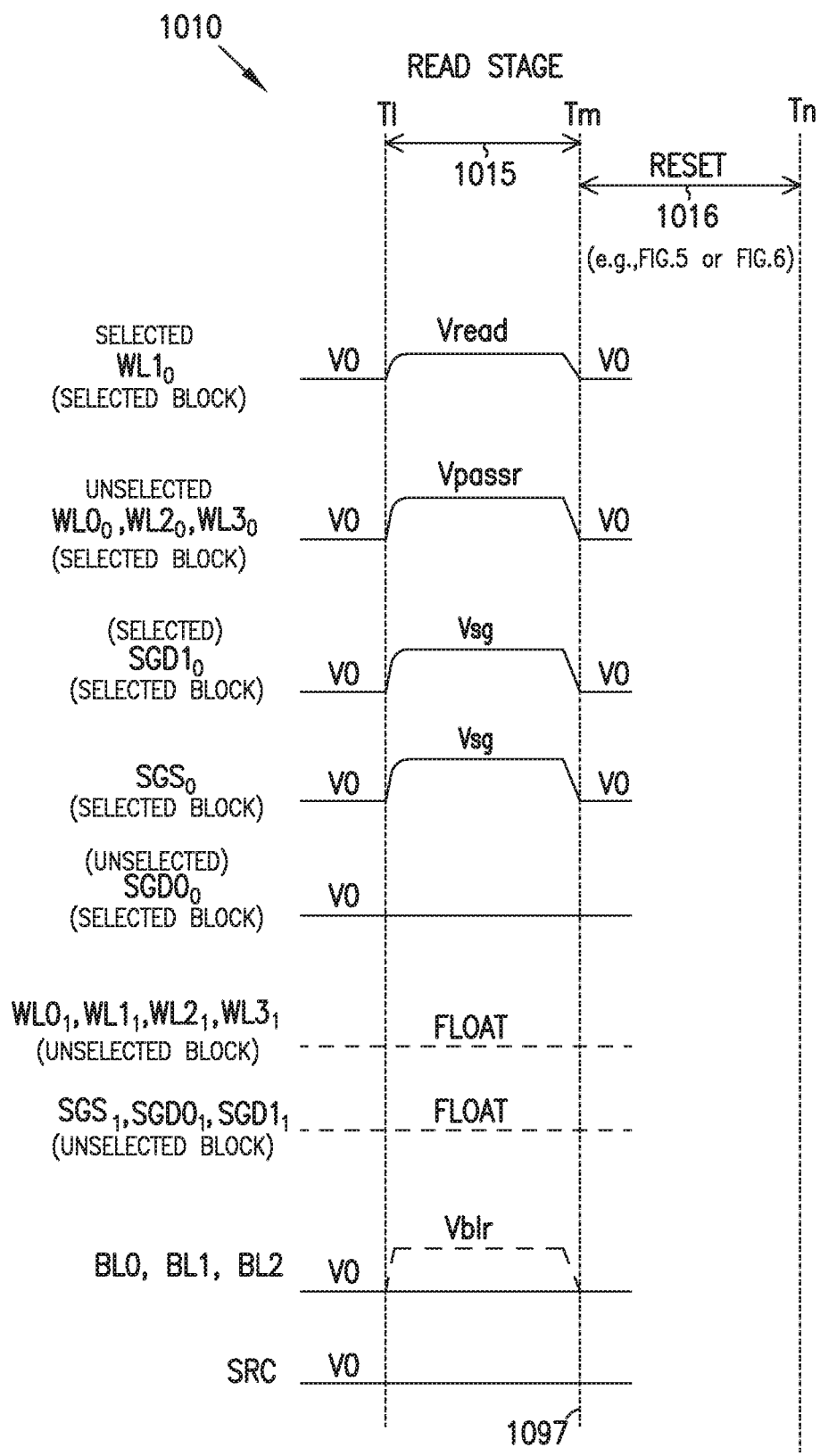
FIG. 11A is a timing diagram showing waveforms of some of the signals of the memory device of FIG. 2A and FIG. 2B during the read operation of FIG. 10, according to an embodiment of the invention.

FIG. 11A is a timing diagram showing waveforms of some of the signals of memory device 200 of FIG. 2A and FIG. 2B during read operation 1010 of FIG. 10, according to an embodiment of the invention. In FIG. 11A, stages 1015 and 1016 correspond to those shown in FIG. 10. The signals (e.g., WL0, WL1, $WL2_1$, and $WL3_1$) in FIG. 11A correspond to the same signals shown in FIG. 2A. The following description refers to FIG. 2A, FIG. 2B, FIG. 10, and FIG. 11A.

Selected and unselected elements during read operation 1010 can be the same as those in write operation 310 (FIG. 3 and FIG. 4). For example, in read operation 1010, memory block $203_0$ (FIG. 2A) is assumed to be a selected memory block, memory block $203_1$ is assumed to be an unselected memory block, memory cell string 231 is assumed to be a selected memory cell string. Memory cell string 231 and memory cell 211 of memory cell string are assumed to be a selected memory cell string and a selected memory cell, respectively. Thus, control gate 251 of the selected block (associated with signal $WL1_0$) can be a selected control gate. Control gates 250, 252, and 253 of the selected block (associated with signals $WL0_0$, $WL2_0$, and $WL3_0$) can be unselected control gates. Select gate 286 of the selected block (associated with corresponding signal $SGD1_0$) can be a selected select gate. Select gate 285 of the selected block (associated with signal $SGD0_0$) can be an unselected select gate. Select gate 280 of the selected block (associated with signal $SGS_0$) can be a selected select gate. In memory block $203_1$, control gates 250, 251, 252, and 253, (associated with signals $WL0_1$, $WL1_1$, $WL2_1$, and $WL3_1$) can be unselected control gates. Select gates 280, 285, and 286 of the unselected block (associated with signals $SGS_1$, $SGD0_1$, and $SGD1_1$) can be unselected select gates.

As shown in FIG. 11A, read stage 1015 can be performed during a time interval between times T1 and Tm to determine the value of information stored in the selected memory cell. Reset stage 1016 can be performed during a time interval between times Tm and Tn.

In read stage 1015, memory device 200 can apply a voltage Vread to control gate 251 of the selected block (associated with signal $WL1_0$) during a time interval between times T1 and Tm. The voltage on line 251 can be at voltage V0 before time T1. Memory device 200 can apply a voltage Vpassr to control gates 250, 252, and 253 of the selected block (associated with signals $WL0_0$, $WL2_0$, and $WL3_0$) during a time interval between time T1 and Tm. The voltage on control gates 250, 252, and 253 can be at voltage V0 before time T1. Each of voltages Vread and Vpassr can have a positive value greater than that of voltage V0. The value of voltage Vpassr can be greater than the value of voltage Vread.

In read stage 1015, memory device 200 can apply a voltage Vsg to select gate 286 of the selected block (associated with signals $SGD1_0$) and select gate 280 of the selected block (associated with signals $SGS_0$). The voltage on select gates 280 and 286 can be at voltage V0 before times T1. Memory device 200 can apply voltage V0 to select gate 285 of the selected block (associated with signal $SGD0_0$) in read stage 1015.

The voltage on lines 270, 271, and 272 (associated with signals BL0, BL1, and BL2) in read stage 1015 can be at voltage Vblr or voltage V0, depending on the value of information stored in the selected memory cell. The voltage on line 291 (associated with signal SRC) in read stage 1015 can be at voltage V0.

Control gates 250, 251, 252, and 253 of the unselected block (associated with signals $WL0_1$, $WL1_1$, $WL2_1$, and $WL3_1$) and select gates 280, 285, and 286 of the unselected block (associated with signals $SGS_1$, $SGD0_1$, and $SGD1_1$) can be in a float condition.

In read stage 1015, in memory block $203_0$, the potentials of body 240 (FIG. 2B) of memory cell string 231 (selected) and unselected memory cell strings that share the same control gates 250, 251, 252, and 253 with memory cell string 231 may fall to a negative potential at the end of read stage 1015 (e.g., at time 1097). The negative potential may cause undesirable situations in memory block $203_0$, such as gate stress and hot electron injection situations, as described above (e.g., with reference to FIG. 4 through FIG. 6). Reset stage 1016 (FIG. 10 and FIG. 11A) may be performed to control (e.g., increase) the potential of body 240, such as to increase the potential of body 240 from a negative potential to zero or near zero volts. As a result, the gate stress situation and hot electron injection situations in read stage 1015 may be avoided. Reset stage 1016 can include either the reset stage 516 or reset stage 616 described above with reference to FIG. 5 and FIG. 6, respectively. Thus, the waveforms associated with reset stage 516 in FIG. 5 or reset stage 616 in FIG. 6 can be used for the reset stage 1016 in FIG. 11A.

As mentioned above in the description of FIG. 3, write verify stage 317 can include a read stage, such as read stage 1015 (FIG. 10 and FIG. 11A). Thus, the waveforms for the combination of write verify stage 317 and reset stage 316 in FIG. 3 (reset stage 316 after time 399 in FIG. 3) can be similar to or identical to those of the combination of read stage 1015 and reset stage 1016 of FIG. 11A.

Figure 11B:
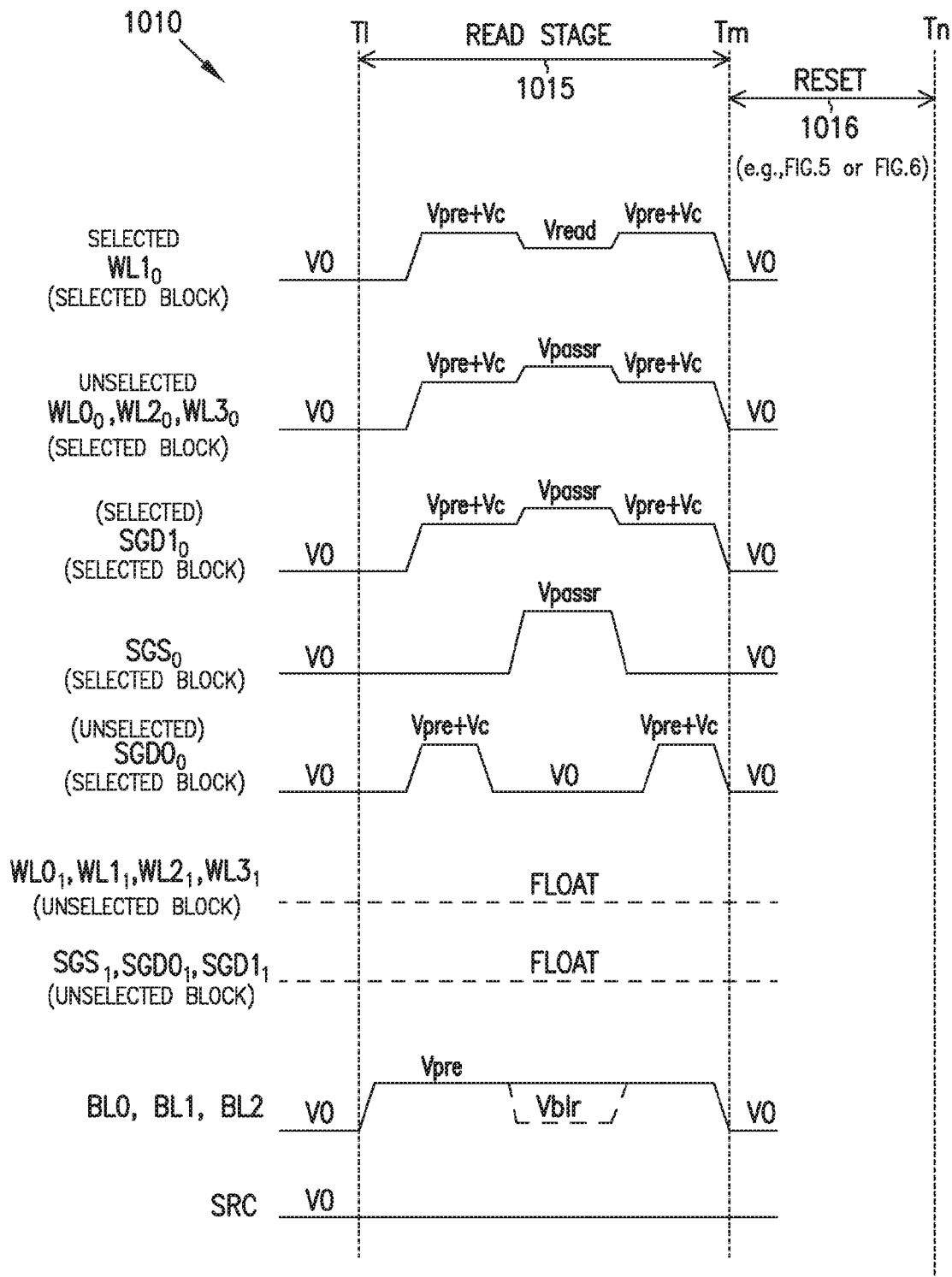
FIG. 11B is an alternative timing diagram showing waveforms of some of the signals of the memory device of FIG. 2A and FIG. 2B during the read operation of FIG. 10, according to an embodiment of the invention.

FIG. 11B is an alternative timing diagram showing waveforms of some of the signals of the memory device of FIG. 2A and FIG. 2B during the read operation of FIG. 10, according to an embodiment of the invention. In FIG. 11B, stages 1015 and 1016 correspond to those shown in FIG. 10. The signals (e.g., $WL0_1$, $WL1_1$, $WL2_1$, and $WL3_1$) in FIG. 11B correspond to the same signals shown in FIG. 2A. The following description refers to FIG. 2A, FIG. 2B, FIG. 10, and FIG. 11B.

Selected and unselected elements during read operation 1010 can be the same as those in write operation 310 (FIG. 3 and FIG. 4). For example, in read operation 1010, memory block $203_0$ (FIG. 2A) is assumed to be a selected memory block, memory block $203_1$ is assumed to be an unselected memory block, memory cell string 231 is assumed to be a selected memory cell string. Memory cell string 231 and memory cell 211 of memory cell string are assumed to be a selected memory cell string and a selected memory cell, respectively. Thus, control gate 251 of the selected block (associated with signal $WL1_0$) can be a selected control gate. Control gates 250, 252, and 253 of the selected block (associated with signals $WL0_0$, $WL2_0$, and $WL3_0$) can be unselected control gates. Select gate 286 of the selected block (associated with corresponding signal $SGD1_0$) can be a selected select gate. Select gate 285 of the selected block (associated with signal $SGD0_0$) can be an unselected select gate. Select gate 280 of the selected block (associated with signal $SGS_0$) can be a selected select gate. In memory block $203_1$, control gates 250, 251, 252, and 253, (associated with signals $WL0_1$, $WL1_1$, $WL2_1$, and $WL3_1$) can be unselected control gates. Select gates 280, 285, and 286 of the unselected block (associated with signals $SGS_1$, $SGD0_1$, and $SGD1_1$) can be unselected select gates.

As shown in FIG. 11B, read stage 1015 can be performed during a time interval between times T1 and Tm to determine the value of information stored in the selected memory cell. Reset stage 1016 can be performed during a time interval between times Tm and Tn.

In read stage 1015, memory device 200 can apply voltages having different values to control gate 251 of the selected block (associated with signal $WL1_0$) during different time intervals between times T1 and Tm. For example, memory device 200 can apply voltages Vpre+Vc, Vread, and Vpre+Vc to control gate 251 of the selected block in the order shown in FIG. 11B. The voltage on line 251 can be at voltage V0 before time T1. Voltage Vpre can have a value equal to the supply voltage (e.g., Vcc) of memory device 200. Voltage Vc can have a positive value. Voltage Vread can have a positive value greater than that of voltage V0 and less than the sum of voltage Vpre+Vc.

Memory device 200 can apply voltages having different values to control gates 250, 252, and 253 of the selected block (associated with signals $WL0_0$, $WL2_0$, and $WL3_0$) during different time intervals between times T1 and Tm. For example, memory device 200 can apply voltages Vpre+Vc, Vpassr, and Vpre+Vc to control gates 250, 252, and 253 of the selected block the order shown in FIG. 11B. The voltage on control gates 250, 252, and 253 can be at voltage V0 before time T1. Voltage Vpassr can have a positive value greater than that of voltage V0 and greater than the sum of voltage Vpre+Vc.

In read stage 1015, memory device 200 can apply different voltages to select gate 286 of the selected block (associated with signals $SGD1_0$) during different time intervals between times T1 and Tm. As shown in FIG. 11B, the voltages applied to select gate 286 of the selected block can be the same as the voltages (e.g., Vpre+Vc, Vpassr, and Vpre+Vc) applied to control gates 250, 252, and 253 of the selected block (associated with signals $WL0_0$, $WL2_0$, and $WL3_0$).

Memory device 200 can apply voltage Vpassr to select gate 280 of the selected block (associated with signals $SGS_0$) during a time interval between times T1 and Tm. For example, as shown in FIG. 11B, voltage Vpassr can be applied to select gate 280 of the selected block while voltage Vpassr is also applied to control gates 250, 252, and 253 of the selected block (associated with signals $WL0_0$, $WL2_0$, and $WL3_0$) and to select gate 286 of the selected block (associated with signals $SGD1_0$). The voltage on select gate 280 of the selected block can be at voltage V0 before time T1.

Memory device 200 can apply voltage Vpre+Vc to select gate 285 of the selected block (associated with signal $SGD0_0$) during different time intervals between times T1 and Tm. For example, as shown in FIG. 11B, voltage Vpre+Vc can be applied to gate 285 of the selected block while voltage Vpre+Vc is also applied to control gate 251 of the selected block (associated with signal $WL1_0$), to control gates 250, 252, and 253 of the selected block (associated with signals $WL0_0$, $WL2_0$, and $WL3_0$), and to select gate 286 of the selected block (associated with signals $SGD1_0$). The voltage on select gate 285 of the selected block can be at voltage V0 before time T1.

The voltage on lines 270, 271, and 272 (associated with signals BL0, BL1, and BL2) in read stage 1015 can be at voltage Vpre or voltage Vblr (e.g., V0) depending on the value of information stored in the selected memory cell. The voltage on line 291 (associated with signal SRC) in read stage 1015 can be at voltage V0.

Control gates 250, 251, 252, and 253 of the unselected block (associated with signals $WL0_1$, $WL1_1$, $WL2_1$, and $WL3_1$) and select gates 280, 285, and 286 of the unselected block (associated with signals $SGS_1$, $SGD0_1$, and $SGD1_1$) can be in a float condition.

In read stage 1015, in memory block $203_0$, the potentials of body 240 (FIG. 2B) of memory cell string 231 (selected) and unselected memory cell strings that share the same control gates 250, 251, 252, and 253 with memory cell string 231 may fall to a negative potential at the end of read stage 1015 (e.g., at time 1097). The negative potential may cause undesirable situations in memory block $203_0$, such as gate stress and hot electron injection situations, as described above (e.g., with reference to FIG. 4 through FIG. 6). Reset stage 1016 (FIG. 10 and FIG. 11B) may be performed to control (e.g., increase) the potential of body 240, such as to increase the potential of body 240 from a negative potential to zero or near zero volts. As a result, the gate stress situation and hot electron injection situations in read stage 1015 may be avoided. Reset stage 1016 can include either the reset stage 516 or reset stage 616 described above with reference to FIG. 5 and FIG. 6, respectively. Thus, the waveforms associated with reset stage 516 in FIG. 5 or reset stage 616 in FIG. 6 can be used for the reset stage 1016 in FIG. 11B.

As mentioned above in the description of FIG. 3, write verify stage 317 can include a read stage, such as read stage 1015 (FIG. 10 and FIG. 11B). Thus, the waveforms for the combination of write verify stage 317 and reset stage 316 in FIG. 3 (reset stage 316 after time 399 in FIG. 3) can be similar to or identical to those of the combination of read stage 1015 and reset stage 1016 of FIG. 11B.

Figure 12:
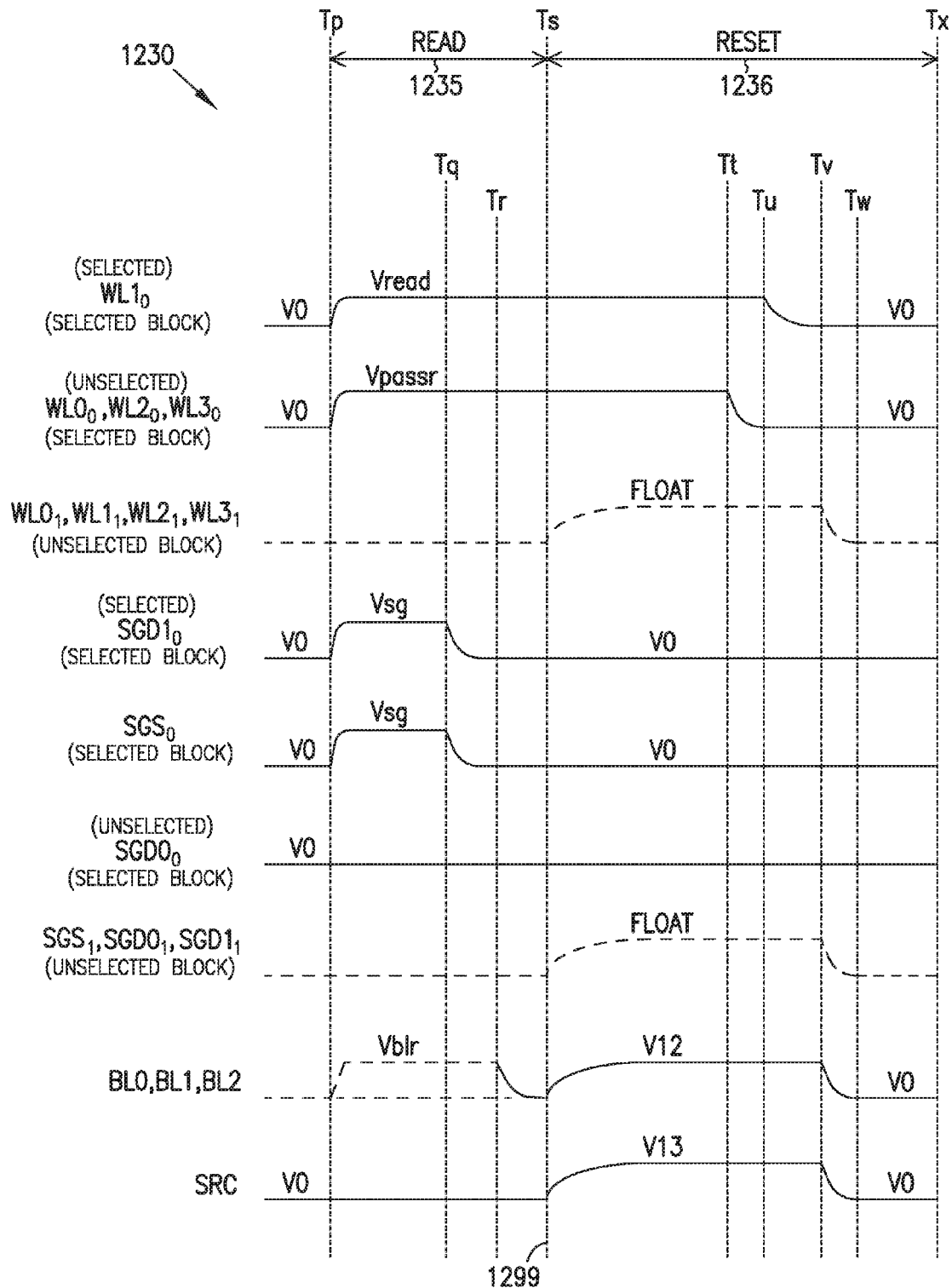
FIG. 12 is a timing diagram showing waveforms of some of the signals of the memory device of FIG. 2A and FIG. 2B during an alternative read operation, according to an embodiment of the invention.

FIG. 12 is a timing diagram showing waveforms of some of the signals of memory device 200 of FIG. 2A and FIG. 2B during a read operation 1230, according to an embodiment of the invention. Memory device 200 can be configured to perform read operation 1230 (FIG. 12) as an alternative for read operation 1010 (FIG. 10 and either FIG. 11A or FIG. 11B).

In FIG. 12, read stage 1235 can determine the value of information stored in a selected memory cell among memory cells 210, 211, 212, and 213 of a memory cell string, such as memory cell string 231. Reset stage 1236 can be performed to control the potential of body 240, such as by injecting holes (e.g., generated by GIDL current) into body 240 in order to remove or minimize the negative potential in body 240, as described above with reference to FIG. 4 through FIG. 6.

In read stage 1235, memory device 200 can apply voltage Vread to control gate 251 of the selected block (associated with signal $WL1_0$) between times Tp and Tu, voltage Vpassr to control gates 250, 252, and 253 of the selected block (associated with signals $WL0_0$, $WL2_0$, and $WL3_0$) between times Tp and Tt, and voltage Vsg to select gates 286 and 280 of the selected block (associated with signals $SGD1_0$ and $SGS_0$) between times Tp and Tq. Memory device 200 can apply voltage V0 to select gate 285 of the selected block (associated with signals $SGD0_0$) between times Tp and Tx. At time Tq, voltage Vsg can be decreased such that it can reach voltage V0 at time Tr.

The voltage on lines 270, 271, and 272 (associated with signals BL0, BL1, and BL2) in read stage 1235 can be at voltage Vblr or voltage V0, depending on the value of information stored in the selected memory cell. The voltage on line 291 in read stage 1235 can be at voltage V0.

Control gates 250, 251, 252, and 253 of an unselected block (associated with signals $WL0_1$, $WL1_1$, $WL2_1$, and $WL3_1$) and select gates 280, 285, and 286 of an unselected block (associated with signals $SGS_1$, $SGD0_1$, and $SGD1_1$) can be in a float condition.

At the end of read stage 1235 (e.g., at time 1299), the potentials of body 240 (FIG. 2B) of memory cell string 231 (selected) and unselected memory cell strings that share the same control gates 250, 251, 252, and 253 with memory cell string 231 may fall to a negative potential. Reset stage 1236 can be performed to control the potential of body 240, such as by injecting holes (e.g., generated by GIDL current) into body 240 in order to remove or minimize the negative potential in body 240.

In reset stage 1236, memory device 200 can hold the voltage on control gate 251 of the selected block at Vread from time Ts to time Tu and hold the voltage on control gates 250, 252, and 253 of the selected block at Vpassr from time Ts to time Tt. At time Tt, voltage Vpassr can be reduced such that it can reach voltage V0 by time Tu. At time Tu, voltage Vread can be reduced such that it can reach voltage V0 by time Tv.

In reset stage 1236, memory device 200 can increase the voltage on lines 270, 271, and 272 from voltage V0 (at time Ts) to voltage V12 and hold lines 270, 271, and 272 at voltage V12 for a time interval (e.g., between times Ts and Tv) to induce GIDL current (e.g., at junction 244 in FIG. 2B). At time Tv, voltage V12 can be decreased such that it can reach voltage V0 by the end of reset stage 1236 (e.g., between times Tw and Tx). In a similar fashion, in reset stage 1236, memory device 200 can increase the voltage on line 291 from voltage V0 to voltage V13, hold line 291 at voltage V13 for a time interval to induce GIDL current (e.g., at junction 245 in FIG. 2B). Then, voltage V13 can be decreased such that it can reach voltage V0 by the end of reset stage 1236.

Each of voltages V12 and V13 can have a positive value. The values of voltages V12 and V9 can be the same or different. For example, the value of voltage V12 can be equal to, less than, or greater than the value of voltage V9. Voltage V0 applied to select gates 280, 285, and 286 of the selected block between times Ts and Tv can be zero volts. Alternatively, a voltage having a positive value can be applied to select gates 280, 285, and 286 between times Ts and Tv as long as such positive value is less than the value of voltage V12 and V13, so that GIDL current can occur at junction 244 or 245 or both (FIG. 2B) to provide holes to body 240 between times Ts and Tv.

As mentioned above in the description of FIG. 3, write verify stage 317 can include a read stage, such as read stage 1235 of FIG. 12. Thus, the waveforms for the combination of write verify stage 317 and reset stage 316 of FIG. 3 (reset stage 316 after time 399 of FIG. 3) can be similar to or identical to the waveforms of the combination of read stage 1235 and reset stage 1236 of FIG. 12.

Figure 13:
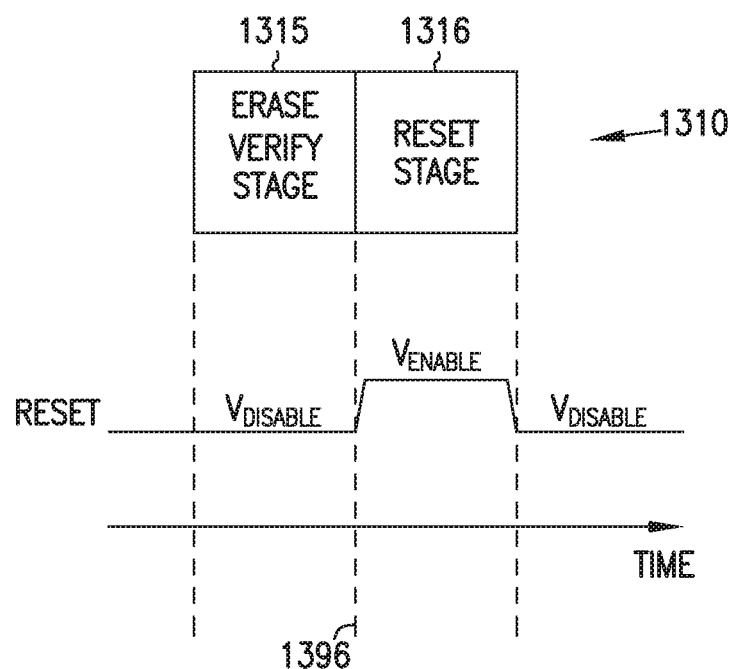
FIG. 13 shows a diagram illustrating different stages of an erase operation of the memory device of FIG. 2A and FIG. 2B, according to an embodiment of the invention.

FIG. 13 shows a diagram illustrating an erase verify stage 1315 and a reset stage 1316 of an erase operation 1310 of memory device 200 of FIG. 2A and FIG. 2B, according to an embodiment of the invention. Erase verify stage 1315 and a reset stage 1316 can be performed after an erase stage (not shown) of erase operation 1310. In the erase stage, information from some or all memory cells (e.g., 210, 211, 212, and 213) in a memory block (e.g., $203_0$ or $203_1$ in FIG. 2A) can be erased.

In erase verify stage 1315 in FIG. 13, memory device 200 can determine whether the state of selected memory cells in a particular memory block reach their target states after an erase stage is performed. Erase verify stage 1315 can include a read stage, such as read stage 1015 of FIG. 10 and FIG. 11A or read stage 1015 of FIG. 10 and FIG. 11B. Thus, operations and waveforms of signals associated with erase verify stage 1315 (FIG. 13) can be similar to or identical to those of read stage 1015.

Figure 14:
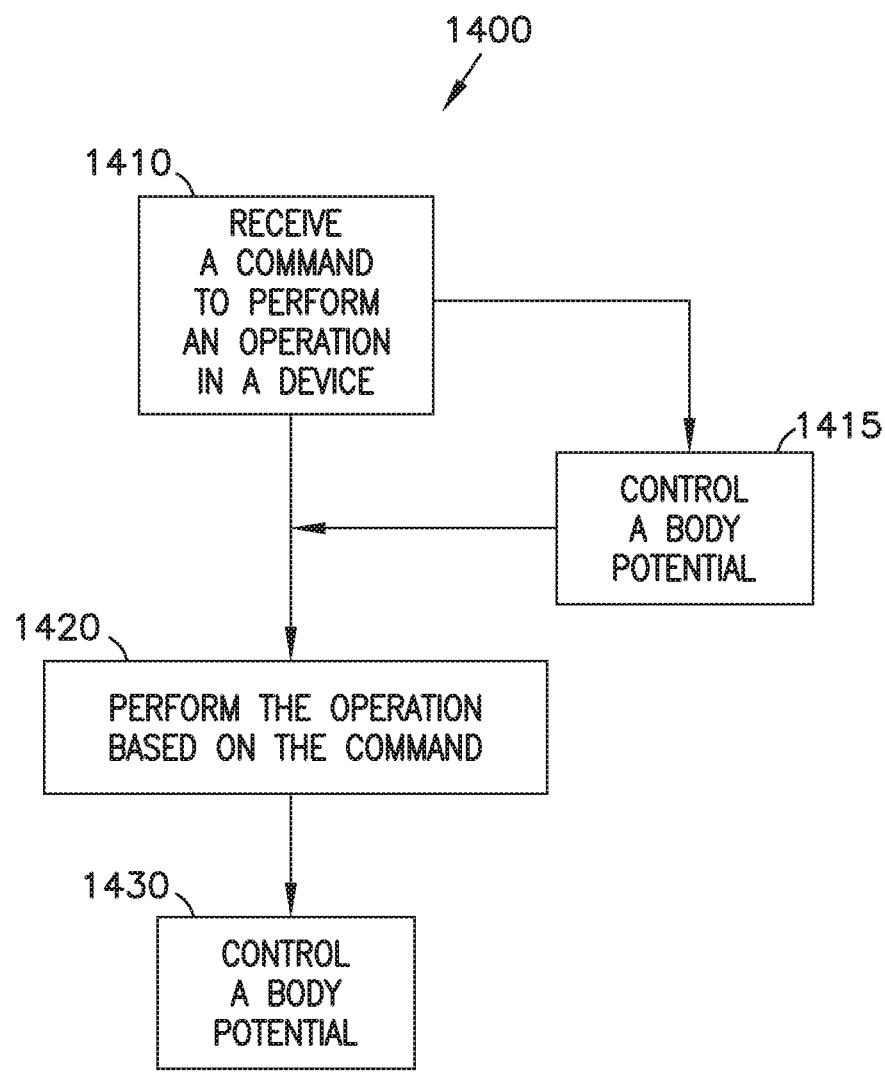
FIG. 14 is a flowchart for a method of performing an operation (e.g., read, write, or erase) in a device, according to an embodiment of the invention.

As shown in FIG. 13, reset stage 1316 can be performed when signal RESET has level VENABLE and can be performed at the end of erase verify stage 1315 (e.g., at time 1396). Reset stage 1316 can include reset stage 1016 of FIG. 10 and FIG. 11A or FIG. 10 and FIG. 11B. Thus, operations and waveforms of signals associated with reset stage 1316 can be similar to or identical to those of reset stage 1016. Memory device 200 can be configured to bypass reset stage 1316 in erase operation 1310. However, performing reset stage 1316 in erase operation 1310 can control the potential of body 240 at the end of erase verify stage, such as by injecting holes (generated from GIDL current) into body 240 in order to remove or minimize the negative potential in body 240 that may otherwise he present in the body 240 at the end of the erase stage FIG. 14 is a flowchart for a method 1400 of performing an operation (e.g., read, write, or erase) in a device, according to an embodiment of the invention. Method 1400 can be used in a memory device such as memory device 100 (FIG. 1) and memory device 200 (FIG. 2A and FIG. 2B).

As shown in FIG. 14, activity 1410 of method 1400 can include receiving a command to perform an operation in a device. The command can include a read, write, or erase command. The command can be provided to the device by a memory controller or a processor external to the device.

Activity 1420 of method 1400 can include performing the operation based on the command received in activity 1410. For example, the operation performed in activity 1420 can include a write operation if the command received in activity 1410 includes a write command. The write operation in activity 1420 can include a write operation described above, such as write operation 310 (FIG. 3 and FIG. 4), write operation 710 (FIG. 7 and FIG. 8), or write operation 920 (FIG. 9).

In another example, the operation performed in activity 1420 can include a read operation if the command received in activity 1410 includes a read command. The read operation in activity 1420 can include a read operation described above, such as read operation 1010 (FIG. 10 and either FIG. 11A or FIG. 11B) or read operation 1230 (FIG. 12).

In a further example, the operation performed in activity 1420 can include an erase operation if the command received in activity 1410 includes an erase command. The erase operation in activity 1420 can include an erase operation described above, such as erase operation 1310 (FIG. 13).

Activity 1430 of method 1400 can include controlling a potential of a body associated with a memory cell string of the device. The body in activity 1430 can include a body of a memory cell string of the device, such as body 240 (FIG. 2B) of memory cell string 231 in FIG. 2A or other memory cell string of memory device 200. Controlling the potential of the body in activity 1430 can include performing a reset stage, such as performing one of the reset stages described above with reference to FIG. 1 through FIG. 13. Thus, controlling the potential of the body in activity 1430 can include performing activities in a reset stage described above with reference to FIG. 1 through FIG. 13. Such activities can include inducing GIDL current in a body associated with a memory cell string, injecting holes into a body associated with a memory cell string, removing excess electrons from a body associated with a memory cell string, increasing the potential of a body associated with a memory cell string, and other activities described above with reference to FIG. 1 through FIG. 13.

As shown in FIG. 14, method 1400 can also include activity 1415, which can be similar to or identical to activity 1430. For example, activity 1415 can include controlling a potential of a body associated with a memory cell string of the device. Controlling the potential of the body in activity 1415 can include performing activities in a reset stage described above with reference to FIG. 1 through FIG. 13.

Activity 1415 can be performed before activity 1420 is performed. For example, if the command received in activity 1410 includes a write command, then, as described above, activity 1420 can perform a write operation, which can include a write stage. However, before the write stage in activity 1420 is performed, activity 1425 can be performed. For example, activity 1415 can include performing a reset stage before the write stage is performed in activity 1420. In some cases, method 1400 may omits activity 1415.

The illustrations of apparatuses (e.g., memory devices 100 and 200) and methods (e.g., operating methods associated with memory devices 100 and 200, and methods associated with FIG. 14) are intended to provide a general understanding of the structure of various embodiments and are not intended to provide a complete description of all the elements and features of apparatuses that might make use of the structures described herein. An apparatus herein can refer to, for example, circuitry, a die, a device (e.g., memory devices 100 and 200) or a system (e.g., a computer, a cellular phone, or other electronic system) that includes a device such as memory devices 100 and 200.

The apparatuses (e.g., memory devices 100 and 200 or part of memory devices 100 and 200, including memory control unit 116 in FIG. 1, reset circuit 195 in FIG. 1, and reset circuit 295 in FIG. 2A) described above may all be characterized as "modules" (or "module") herein. Such modules may include hardware circuitry, single and/or multi-processor circuits, memory circuits, software program modules and objects and/or firmware, and combinations thereof, as desired and/or as appropriate for particular implementations of various embodiments.

Memory devices 100 and 200 may be included in apparatuses (e.g., electronic circuitry) such as high-speed computers, communication and signal processing circuitry, single or multi-processor modules, single or multiple embedded processors, multi-core processors, message information switches, and application-specific modules including multilayer, multi-chip modules. Such apparatuses may further be included as sub-components within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 14 include apparatuses and methods having a memory cell string including memory cells located in different levels of the apparatus and a data line coupled to the memory cell string. The memory cell string includes a pillar body associated with the memory cells. At least one of such apparatus can include a module configured to store information in a memory cell among memory cells and/or to determine a value of information stored in a memory cell among memory cells. The module can also be configured to apply a voltage having a positive value to the data line and/or a source to control a potential of the body. Other embodiments including additional apparatuses and methods are described.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
   a memory cell string including memory cells located in different levels of the apparatus, the memory cell string including a body associated with the memory cells;
   a source coupled to the memory cell string;
   a data line coupled to the memory cell string; and
   a module configured to perform a write stage to store information in a memory cell among the memory cells, to perform a write verify stage to determine whether a value of information stored in the memory cell reaches a target value, and to apply a voltage having a positive value to the data line during a stage between the write stage and the write verify, wherein the memory cell string is included in a select block of a memory device, and the module is configured to put a select gate in an unselected block of the memory device in a float condition.

2. The apparatus of claim 1, wherein the module is configured to apply a voltage having ground potential to a control gate associated with the memory cell string during the stage between the write stage and the write verify stage.

3. The apparatus of claim 2, wherein the memory cell string is included in a select block of a memory device, and the module is configured to put a control gate in an unselected block of the memory device in a float condition.

4. An apparatus comprising:
   a memory cell string including memory cells located in different levels of the apparatus, the memory cell string including a body associated with the memory cells;
   a source coupled to the memory cell string;
   a data line coupled to the memory cell string; and
   a module configured to perform a write stage to store information in a memory cell among the memory cells, to perform a write verify stage to determine whether a value of information stored in the memory cell reaches a target value, and to apply a voltage having a positive value to the data line during a stage between the write stage and the write verify, wherein the module is configured to apply round potential to a select gate associated with a select transistor of the memory cell string during the stage between the write stage and the write verify stage, and wherein the memory cell string is included in a select block of a memory device, and the module is configured to put a select gate in an unselected block of the memory device in a float condition.

5. The apparatus of claim 1, wherein the module is configured to:
   apply a voltage having a positive value to a control gate associated with the memory cell string during a first time interval of the stage between the write stage and the write verify stage; and
   apply a voltage having ground potential to the control gate during a second time interval of the stage between the write stage and the write verify stage.

6. An apparatus comprising:
   a memory cell string including memory cells located in different levels of the apparatus, the memory cell string including a body associated with the memory cells;
   a source coupled to the memory cell string;
   a data line coupled to the memory cell string; and
   a module configured to perform a write stage to store information in a memory cell among the memory cells, to perform a write verify stage to determine whether a value of information stored in the memory cell reaches a target value, and to apply a voltage having a positive value to the data line during a stage between the write stage and the write verify, wherein the module is configured to apply a voltage having a positive value to a control gate associated with the memory cell string during a first time interval of the stage between the write stage and the write verify stage, and apply a voltage having ground potential to the control gate during a second time interval of the stage between the write stage and the write verify stage, and wherein the memory cell string is included in a select block of a memory device, and the module is configured to:
   apply a voltage having ground potential to a control gate in an unselected block of the memory device during the first time; and
   put the control gate in the unselected block in a float condition during the second time interval.

7. The apparatus of claim 1, wherein the module is configured to:
   apply a voltage having a positive value to a select gate associated with a select transistor of the memory cell string during a first time interval of the stage between the write stage and the write verify stage; and
   apply a voltage having ground potential to the select gate during a second time interval of the stage between the write stage and the write verify stage.

8. An apparatus comprising:
   a memory cell string including memory cells located in different levels of the apparatus, the memory cell string including a body associated with the memory cells;
   a source coupled to the memory cell string;
   a data line coupled to the memory cell string; and
   a module configured to perform a write stage to store information in a memory cell among the memory cells, to perform a write verify stage to determine whether a value of information stored in the memory cell reaches a target value, and to apply a voltage having a positive value to the data line during a stage between the write stage and the write verify, wherein the module is configured to apply a voltage having a positive value to a select gate associated with a select transistor of the memory cell string during a first time interval of the stage between the write stage and the write verify stage, and apply a voltage having ground potential to the select gate during a second time interval of the stage between the write stage and the write verify stage, and wherein the memory cell string is included in a select block of a memory device, and the module is configured to:

apply a voltage having ground potential to a control gate in an unselected block of the memory device during the first time; and put the control gate in the unselected block in a float condition during the second time interval.

9. An apparatus comprising:
a memory cell string including memory cells located in different levels of the apparatus, the memory cell string including a body associated with the memory cells;
a source coupled to the memory cell string;
a data line coupled to the memory cell string; and
a module configured to perform a write stage to store information in a memory cell among the memory cells, to perform a write verify stage to determine whether a value of information stored in the memory cell reaches a target value, and to apply a voltage having a positive value to the source during a stage between the write stage and the write verify, wherein the memory cell string is included in a select block of a memory device, and the module is configured to put a select gate in an unselected block of the memory device in a float condition.

10. The apparatus of claim 9, wherein the module is configured to apply a voltage having ground potential to a control gate associated with the memory cell string during the stage between the write stage and the write verify stage.

11. The apparatus of claim 10, wherein the memory cell string is included in a select block of a memory device, and the module is configured to put a control gate in an unselected block of the memory device in a float condition.

12. An apparatus comprising:
a memory cell string including memory cells located in different levels of the apparatus, the memory cell string including a body associated with the memory cells;
a source coupled to the memory cell string;
a data line coupled to the memory cell string; and
a module configured to perform a write stage to store information in a memory cell among the memory cells, to perform a write verify stage to determine whether a value of information stored in the memory cell reaches a target value, and to apply a voltage having a positive value to the source during a stage between the write stage and the write verify, wherein the module is configured to apply ground potential to a select gate associated with a select transistor of the memory cell string during the stage between the write stage and the write verify stage, and wherein the memory cell string is included in a select block of a memory device, and the module is configured to put a select gate in an unselected block of the memory device in a float condition.

13. The apparatus of claim 9, wherein the module is configured to:
apply a voltage having a positive value to a control gate associated with the memory cell string during a first time interval of the stage between the write stage and the write verify stage; and
apply a voltage having ground potential to the control gate during a second time interval of the stage between the write stage and the write verify stage.

14. An apparatus comprising:
a memory cell string including memory cells located in different levels of the apparatus, the memory cell string including a body associated with the memory cells;
a source coupled to the memory cell string;
a data line coupled to the memory cell string; and
a module configured to perform a write stage to store information in a memory cell among the memory cells, to perform a write verify o determine whether a value of information stored in the memory cell reaches a target value, and to apply a voltage having a positive value to the source during a stage between the write stage and the write verify, wherein the module is configured to apply a voltage having a positive value to a control gate associated with the memory cell string during a first time interval of the stage between the write stage and the write verify stage, and apply a voltage having ground potential to the control gate during a second time interval of the stage between the write stage and the write verify stage, wherein the memory cell string is included in a select block of a memory device, and the module is configured to:
apply a voltage having ground potential a control gate in an unselected block of the memory device during the first time; and
put the control gate in the unselected block in a float condition during the second time interval.

15. The apparatus of claim 9, wherein the module is configured to:
apply a voltage having a positive value to a select gate associated with a select transistor of the memory cell string during a first time interval of the stage between the write stage and the write verify stage; and
apply a voltage having ground potential to the select gate during a second time interval of the stage between the write stage and the write verify stage.

16. An apparatus comprising:
a memory cell string including memory cells located in different levels of the apparatus, the memory cell string including a body associated with the memory cells;
a source coupled to the memory cell string;
a data line coupled to the memory cell string; and
a module configured to perform a write stage to store information in a memory cell among the memory cells, to perform a write verify stage to determine whether a value of information stored in the memory cell reaches a target value, and to apply a voltage having a positive value to the source during a stage between the write stage and the write verify, wherein the module is configured to apply a voltage having a positive value to a select gate associated with a select transistor of the memory cell string during a first time interval of the stage between the write stage and the write verify stage, and apply a voltage having ground potential to the select gate during a second time interval of the stage between the write stage and the write verify stage, and wherein the memory cell string is included in a select block of a memory device, and the module is configured to:
apply a voltage having ground potential a control gate in an unselected block of the memory device during the first time; and
put the control gate in the unselected block in a float condition during the second time interval.

17. A method comprising:
storing information, during a write stage of memory device, in a selected memory cell among memory cells of a memory cell string of the memory device, the memory cells of the memory cell string located in different levels of the memory device, the memory cell string including a body associated with the memory cells, wherein the memory cell string is included in a select block of the memory device;

determining, during a write verify stage of the memory device, whether a value of the information stored in the selected memory cell reaches a target value;

applying a voltage having a positive value to at least one of a data line coupled to the memory cell string and a source coupled to the memory cell string during a stage between the write stage and the write verify stage; and putting a select gate in an unselected block of the memory device in a float condition.

18. The method of claim 17, further comprising:

applying a voltage having ground potential to at least one of a control gate and a select gate associated with the memory cell string during the stage between the write stage and the write verify stage.

* * * * *